(12) United States Patent
Chen et al.

(10) Patent No.: US 11,063,614 B1
(45) Date of Patent: Jul. 13, 2021

(54) POLAR DECODER PROCESSOR

(71) Applicant: Cadence Design Systems, Inc., San Jose, CA (US)

(72) Inventors: Rong Chen, San Jose, CA (US); Poojan Rajeshbhai Shah, Gujarat (IN); Dan Nicolaescu, Fair Oaks, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 16/690,575

(22) Filed: Nov. 21, 2019

(51) Int. Cl.
*H03M 13/45* (2006.01)
*H03M 13/13* (2006.01)

(52) U.S. Cl.
CPC .......... *H03M 13/45* (2013.01); *H03M 13/13* (2013.01)

(58) Field of Classification Search
CPC ...................................... H03M 13/45
USPC ...................................... 714/752
See application file for complete search history.

(56) References Cited

U.S. PATENT DOCUMENTS

| | | | |
|---|---|---|---|
| 8,689,084 B1 | 4/2014 | Tai | |
| 10,270,470 B2 | 4/2019 | Li et al. | |
| 10,305,514 B2 | 5/2019 | Giard et al. | |
| 10,700,709 B1* | 6/2020 | Old | H04L 1/0057 |
| 2016/0013810 A1 | 1/2016 | Gross et al. | |
| 2017/0155405 A1 | 6/2017 | Ge et al. | |
| 2017/0353269 A1* | 12/2017 | Lin | H03M 13/2933 |
| 2018/0054278 A1 | 2/2018 | Shi et al. | |
| 2018/0331693 A1* | 11/2018 | Lou | H04L 1/0061 |
| 2019/0068225 A1 | 2/2019 | Yu | |
| 2020/0204301 A1* | 6/2020 | Wu | H03M 13/6362 |

OTHER PUBLICATIONS

Erdal Arikan, "Channel polarization: A method for constructing capacity-achieving codes for symmetric binary-input memoryless channels", IEEE, arXiv:0807.3917v5 [cs.IT] Jul. 20, 2009.
Erdal Arkan, A Performance Comparison of Polar Codes and Reed-Muller Codes, IEEE Communications Letters, vol. 12, No. 6, Jun. 2008.
Bo Yuan, et al. "Successive Cancellation List Polar Decoder using Log-likelihood Ratios", Department of Electrical and Computer Engineering, University of Minnesota Twin Cities.

* cited by examiner

*Primary Examiner* — Fritz Alphonse
(74) *Attorney, Agent, or Firm* — Tarolli, Sundheim, Covell & Tummino LLP

(57) ABSTRACT

In some examples, a polar decoder for implementing polar decoding of a codeword can be configured to implement alogarithmic likelihood ratio (LLR), an even bit, and an odd bit buffer, respectively. The polar decoder can be configured to employ a list-to-buffer mapping state register for the LLR buffer for loading LLR values for each path at a given stage of a decoding graph. The polar decoder can be configured to update and store LLR values for each path at the given stage. The polar decoder can be configured to employ a list-to-buffer mapping state register for the even bit buffer for loading even bit values from the even bit buffer and loading odd bit values from the odd bit buffer, and updating even or odd bit values for each path at the given stage of the decoding graph.

20 Claims, 10 Drawing Sheets

| l=0 | l=1 | l=2 | l=3 |
|---|---|---|---|
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 1 |
| 0 | 0 | 0 | 1 |

1104

| l=0 | l=1 | l=2 | l=3 |
|---|---|---|---|
| 1 | 0 | 0 | 0 |
| 0 | 0 | 0 | 0 |
| 0 | 0 | 0 | 0 |
| 1 | 0 | 0 | 0 |
| 0 | 0 | 0 | 0 |
| 0 | 0 | 0 | 0 |
| 0 | 0 | 0 | 0 |
| 0 | 1 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 1 |
| 0 | 0 | 0 | 0 |

| l=0 | l=1 | l=2 | l=3 |
|---|---|---|---|
| 1 | 0 | 0 | 0 |
| 0 | 0 | 0 | 0 |
| 0 | 0 | 0 | 0 |
| 1 | 0 | 0 | 0 |
| 0 | 0 | 0 | 0 |
| 0 | 0 | 0 | 0 |
| 0 | 0 | 0 | 0 |
| 0 | 1 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 1 |
| 0 | 0 | 0 | 0 |

|  | l=0 | l=1 | l=2 | l=3 | ... | l=L-1 |
|---|---|---|---|---|---|---|
| Stage 0 | 0 | 1 | 0 | 3 | ... | L-1 |
| Stage 1 | 0 | 1 | 0 | 3 | ... | L-1 |
| Stage 2 | 0 | 1 | 0 | 3 | ... | L-1 |
| Stage 3 | 0 | 1 | 0 | 3 | ... | L-1 |
| ... |  |  |  |  |  |  |
| Stage n | 0 | 1 | 0 | 3 | ... | L-1 |

POLAR DECODER PROCESSOR

TECHNICAL FIELD

The present disclosure relates to polar decoders.

BACKGROUND

Polar codes are employable as channel codes for wireless communications, and have been selected for uplink and downlink enhanced Mobile Broadband (eMBB) control channel coding for 5th Generation (5G) air interface, also known as the 5G New Radio (NR). These codes are competitive with state-of-the-art error correction codes and have low encoding complexity. Successive Cancellation (SC) and its extensions (e.g., SC List (SCL) decoding) are effective and efficient options for decoding polar coded N-bit codewords in $\log_2 N$ decoding stages. Polarization refers to a coding property that, as code length increases to infinity, bit-channels, also referred to as sub-channels polarize, and respective bit channel capacities approach either zero (completely noisy channel) or one (completely perfect channel). Thus, bits encoded in high capacity sub-channels can experience a channel with a high Signal-to-Noise Ratio (SNR), and can have a relatively high reliability or a high likelihood of being correctly decoded, and bits encoded in low capacity sub-channels can experience a channel with low SNR, and can have a low reliability or a low possibility of being correctly decoded. The fraction of perfect sub-channels can be equal to the capacity of a channel.

SUMMARY

In an example, a polar decoder for implementing polar decoding of a codeword can include a loop controller that can be configured to implement in a vector memory of a vector processor alogarithmic likelihood ratio (LLR) buffer, an even bit buffer, and an odd bit buffer based on memory arrangement data. The polar decoder can include an LLR updater and a bit updater. The LLR updater can be configured to employ a list-to-buffer mapping state register for the LLR buffer for loading stored LLR values from the LLR buffer for each path at a given stage of a decoding graph and storing updated LLR values in the LLR buffer at each LLR update iteration during the polar decoding of the codeword. The bit updater can be configured to employ a list-to-buffer mapping state register for the even bit buffer for loading stored even bit values from the even bit buffer for each path at the given stage of the decoding graph and loading odd bit values from the odd bit buffer at each bit update iteration during the polar decoding of the codeword.

In another example, a method for implementing an LLR update or a bit update at a given stage of a decoding graph based on a list-to-buffer mapping state register can include setting elements of a column of the list-to-buffer mapping state register for a given path to a path number associated with another column of the list-to-buffer mapping state register, retrieving data from at least one buffer representative of a set of input vectors having one of LLR values or bit values, shuffling at least one input vector of the set of input vectors based on a row pattern of a given row of the list-to-buffer mapping state register and implementing the LLR update or the bit update at the given stage of the decoding graph based on the set of input vectors in response to shuffling the at least one input vector of the set of input vectors.

In a further example, a system for implementing polar codeword decoding can include a vector processor that can include a vector memory, one or more state registers and one or more vector registers. The system can further include a polar decoder that can be configured to partition the vector memory of the vector processor based on memory arrangement data to implement an LLR buffer for storing LLR values, an even bit buffer for storing even bit values, and an odd bit buffer for storing odd bit values. The polar decoder can further be configured to generate and store in the one or more state registers a list-to-buffer mapping state register for each of the LLR buffer and the even bit buffer based on mapping state data, store and retrieve LLR values from the LLR buffer using the one or more vector registers for each path at each node of a decoding graph during a polar decoding of the codeword based on the list-to-buffer mapping state register for the LLR buffer, store and retrieve even bit values using the one or more vector registers from the even bit buffer for each path at each node of the decoding graph during the polar decoding of the codeword based on the list-to-buffer mapping state register for the even bit buffer, and store and retrieve odd bit values using the one or more vector registers for each path at the given stage at each node of the decoding graph during the polar decoding of the codeword.

BRIEF DESCRIPTION OF THE DRAWINGS

FIG. 5 illustrates an example of a memory arrangement for a logarithmic likelihood ratio (LLR) buffer.

FIG. 6 illustrates an example of a list-to-buffer mapping state register implemented as a 4×4 matrix for an LLR buffer.

FIG. 11 illustrates an example matrix for an equal flag and an example matrix for a less than flag.

FIG. 12 illustrates an example of a path metric list.

FIG. 13 illustrates an example of a list-to-buffer mapping state register with a killed path and a cloned path.

DETAILED DESCRIPTION

Figure 1:
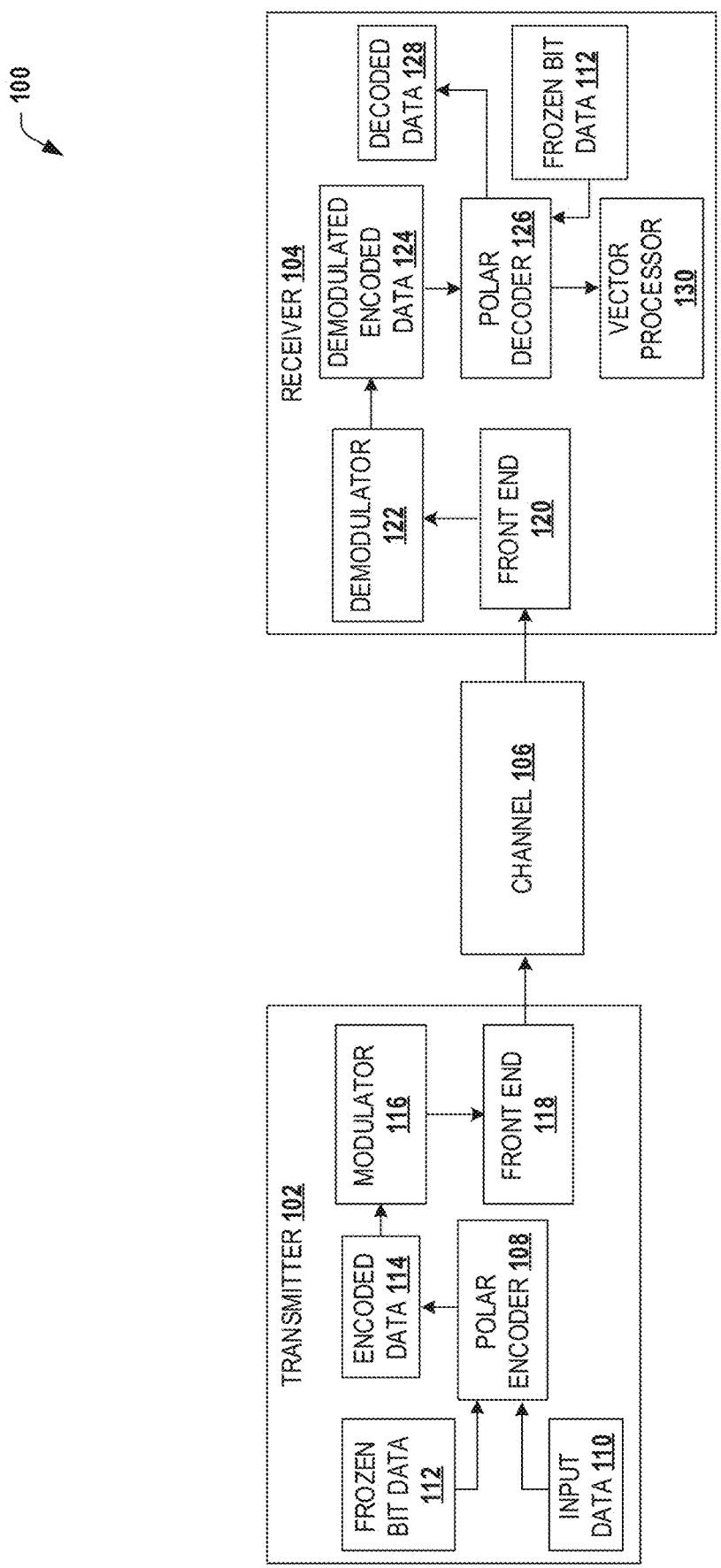
FIG. 1 illustrates an example of a communication system supporting communication of polar encoded information.

The present disclosure relates to polar decoders. In some examples, a polar decoder can be embodied as a combination of polar hardware components and machine readable instructions corresponding to polar decoding instructions. The polar hardware components can be employed on a generic vector processor. As such, in some examples, the vector processor can be configured as a polar decoder vector processor that can implement polar decoding of polar coded N-bit codewords based on the polar decoding instructions. Once executed, the polar decoding instructions can be configured to cause the vector processor to implement vectorized polar decoding via the polar hardware components.

In some examples, the polar decoding instructions can include memory arrangement instructions for storing the vectors and/or results of operations performed by the polar hardware components in a vector memory of the vector processor at each stage of a decoding graph. The calculations can include bits (or bytes) representative of logarithmic likelihood ratio (LLR) values, even bit values and/or odd bit values that can be outputted at each node of the decoding graph. The calculations, such as for a respective node at a given stage, can be stored in the vector memory in a vector form based on addresses assigned for memory elements in the vector memory by the polar hardware components.

In some examples, the polar decoding instructions can include memory arrangement instructions (e.g., data) for implementing buffers on the vector processor for storing generated values based on the decoding graph. The memory arrangement instructions can specify an ordering for storing generated values in the vector memory, such as during the given stage of the decoding graph. Thus, the memory arrangement instructions can logically define (e.g., partition) a storage buffer for each LLR, even and/or odd bit calculations generated during each stage of the decoding graph, such as an LLR buffer, an even bit buffer and an odd bit buffer. The polar decoding instructions can be configured to cause, during each stage of the decoding graph, the polar hardware components to store respective LLR, even and bit calculations (e.g., values) as vector data in a corresponding buffer of the vector memory.

In some examples, the polar decoding instructions can be configured to cause state registers of the vector processor to be accessed to control reading and writing of the memory elements in the vector memory for the buffers during polar decoding of the polar coded N-bit codewords. The state registers can include a list-to-buffer mapping state register for the LLR buffer and for the even bit buffer. The list-to-buffer mapping state register for the LLR buffer and the even bit buffer can be manipulated according to the examples described herein to avoid computationally expensive LLR and bit memory copy operations to implement polar decoding in contrast to other approaches. Each mapping element (e.g., value) of the list-to-buffer mapping state register for the LLR buffer and the even bit buffer can be associated with (e.g., mapped to) a group of memory elements of the LLR buffer or the even bit buffer for a given path. As such, each mapping element of list-to-buffer mapping state register at the given stage of the decoding graph can correspond to memory elements of the LLR buffer or the even bit buffer for the given path.

In additional examples, the polar decoding instructions can be configured cause the polar hardware components to employ the list-to-buffer mapping state register for the LLR buffer and the even bit buffer to determine which memory locations needs to be read from for loading LLR calculations or even bit calculations at the given stage of the decoding graph. Following each LLR and bit update at the given stage of the decoding graph, the list-to-buffer mapping state register for the LLR buffer and/or the even bit buffer can be reset by the polar hardware components based on the polar decoding instructions. Accordingly, computationally expensive manipulations of the LLR buffer and the even bit buffer can be directly avoided by manipulating explicitly the list-to-buffer mapping state register.

In some examples, the polar decoding instructions can cause the polar hardware components to load into respective vector registers the polar encoded data. The polar decoding instructions can control the polar hardware components, such that the polar hardware components implemented component decoders for polar decoding of the polar encoded data based on decoding sequencing data. The decoding sequencing data can characterize the decoding graph for each respective component decoder being implemented on or by the polar hardware components. The decoding graph can include a plurality of stages. A subset of the stages can include f and g computation nodes. Each of the f and g computation nodes can compute a new LLR based on prior computed LLRs.

In some examples, to decode the polar encoded data, the polar decoding instructions can cause the polar hardware components to implement LLR update iterations (e.g., recursions) at each stage along the decoding graph in a first direction based on the list-to-buffer mapping state register for the LLR buffer. The LLR update instructions can cause LLR values for the polar encoded data to be loaded from the LLR buffer into the vector registers for LLR computations by the polar hardware components based on the list-to-buffer mapping state register for the LLR buffer. The LLR values can be loaded as input vectors of LLR values into the vector registers and the polar hardware components can be configured to retrieve or receive the input vector of LLR values for computations. In some examples, at least one input vector of LLR values can be shuffled based on the list-to-buffer mapping state register for the LLR buffer at the given stage. In response to shuffling the at least one input vector of LLR values, the polar hardware components can be configured to at least one f and g computation at the given stage of the decoding graph based on the input vectors. The LLRs at each stage can be updated based on prior computed LLRs, and the updated values can be stored in the LLR buffer in vector form. In response to computing an LLR at a given stage (e.g., Stage 3), the polar hardware components implementing the component decoders can be configured to apply a hard decision on the computed LLR to output an estimate bit value $u_i$.

In further examples, to decode the polar encoded data, the polar decoding instructions can cause the polar hardware components to implement bit update iterations (e.g., recursions) at each stage along the decoding graph in a second direction. The polar decoding instructions can cause the polar hardware components to receive bit update instructions specifying that a bit update is to be implemented. The bit update instructions can cause an input vector of bit values to be loaded from the even bit buffer into the vector registers for bit computations by the polar hardware components based on the list-to-buffer mapping state register for the even bit buffer. The polar decoding instructions can cause an input vector of bit values to be loaded from the odd bit buffer into the vector registers as well.

In some examples, at least one input vector of even bit values from the even bit buffer can be shuffled based on the list-to-buffer mapping state register for the even bit buffer at the given stage. In response to shuffling the at least one input vector of even bit value, the polar hardware components can be configured to implement at least one bit update computation at the given stage of the decoding graph based on the input vectors of bit values according to the polar decoding instructions. In some examples, the polar decoding instructions can cause the polar hardware components to skip bit update recursion for odd bit indexes for the estimate bit values $u_i$ and for even bit indexes employ the list-to-buffer mapping state register for the even bit buffer to implement the bit update recursion for the even bit indexes for the estimate bit values $u_i$, as described herein.

Accordingly, by traversing the decoding graph in the forward and backward direction, the vector processor can be configured based on the polar decoding instructions to implementing polar decoding of polar encoded words. Moreover, during each LLR and bit update iteration, at the given stage, as described herein, the polar decoding instructions can cause the polar hardware components on the vector processor to kill and clone paths by manipulating the list-to-buffer mapping state register for the LLR buffer and the even bit buffer for each LLR and bit update iteration, respectively. In contrast to other approaches, when a path is killed (e.g., pruned), the LLR and bit memory for the killed path needs to be freed and made available for new path, and when a path is cloned, the LLR and bit memory locations are copied to the buffer allocated to the new path. However, cloning of the new path takes many computer cycles to implement. In the present disclosure, the polar hardware components can be configured to kill and clone paths by manipulating the list-to-buffer mapping state register for the LLR buffer and the even bit buffer rather than manipulating the LLR or the bit memory (e.g., directly), as in the other approaches. Column copy functionality being implemented by the polar hardware components can be equivalent to kill and cloning path. Thus, the polar hardware components can be configured to manipulate the list-to-buffer mapping state register for the LLR buffer and the even bit buffer to kill and clone paths based on the polar decoding instructions.

In further examples, the polar decoding instructions can cause the polar hardware components to evaluate each path l for each stage of the decoding graph, such that, in some examples a given number of L paths survive among $2_P*L$ paths that can be created. A path metric (PM) can be used to determine which of the candidate paths can survive. The polar decoding instructions can cause the polar hardware components to compute for each child node a respective PM in the decoding graph. A parent node can have $2^P$ child nodes, where P is number of parallel component decoders, and L previous survived paths can be parent nodes. The polar decoding instructions can cause the polar hardware components to search the $L \times 2^P$ path metrics to find the L largest metric (smallest metric if the metrics are negated). The polar hardware components can be configured to employ the L'th largest metric to select L paths from candidate paths with path metric larger or equal to the L'th largest metric. The parent node (e.g., previous path) that can have no survived children node can be killed and the LLR and bit buffer for that path can be freed and made available for the new path, which can be cloned from the parent node (previous path) that can have multiple survived children. The LLR and bit buffer killing and cloning can correspond to a column that is to be copied to another column of the list-to-buffer mapping state register. Thus, the decoding instructions once executed can cause the polar hardware components on the vector processor to kill and clone paths by updating the list-to-buffer mapping state register based on the selected L paths from the candidate paths having largest metrics.

In some examples, the polar decoding instructions can cause the polar hardware components to copy a given column to another column of the list-to-buffer mapping state register for the LLR buffer and/or the even bit buffer at the given stage. The polar hardware components can be configured to use the LLRs or bit values in a corresponding buffer associated with the given column for the f or g or bit update computations at the polar hardware components implementing the component decoders. By way of further example, the polar decoding instructions can cause the polar hardware components to shuffle the input vectors of the LLRs into the vector registers based on a sequence of values of elements of a corresponding row of the list-to-buffer mapping state register for the LLR buffer. Accordingly, the polar hardware components can be configured to shuffle the input vectors of the LLRs into the vector registers based on a row pattern for a given stage for use during the f-computation at the polar hardware components implementing the component decoders, as described herein.

In even further examples, the polar decoding instructions can be configured to cause the polar hardware components to employ the list-to-buffer mapping state register for the even bit buffer to shuffle input vectors of even bits from the even bit buffer into the vector registers. The polar hardware components can be configured to shuffle the input vectors of even bits in response to copying a given column to another column of the list-to-buffer mapping state register for the even bit buffer at the given stage during a given bit update iteration. The polar hardware components can be configured to shuffle the input vectors of the even bits into the vector registers based on a sequence of values of elements of a corresponding row of the list-to-buffer mapping state register for the even bit buffer. Accordingly, the polar decoding instructions can be configured to cause the polar hardware components to shuffle the input vectors of the even bits into the vector registers based on a row pattern for a given stage for use during the bit computations at the polar hardware components implementing the component decoders, as described herein.

As such, by implementing the polar decoder in a vector processing environment (e.g., based on a vector architecture instruction set) with the list-to-buffer mapping state register for the LLR buffer and the even bit buffer explicit memory copy and memory allocation (e.g., freeing) can be avoided. As such, explicit memory copy and memory allocation and freeing can be mitigated. Consequently, a throughput of the decoding graph (e.g., a SCL decoding algorithm) can be improved by vectoring all steps of the decoding graph and improving a performance of the polar decoder overall. Accordingly, the polar decoder can be implemented on a general purpose vector processor rather than a chip with fixed hardware.

FIG. 1 illustrates an example of a communication system 100 supporting communication of polar encoded information. In some examples, as described herein, the communication system 100 can be representative of a mobile communication system that can be configured for processing (e.g., encoding and decoding) polar encoded codewords. The mobile communication system can include a fifth generation (5G NR) cellular system (or a higher order cellular generation technology), a Mobile Communications ("GSM") system, a Code Division Multiple Access (CDMA) system, a Wideband Code Division Multiple Access (WCDMA) system, a general packet radio service (GPRS), a Long Term Evolution (LTE) system, an LTE frequency division duplex (FDD) system, an LTE time division duplex (TDD), or a Universal Mobile Telecommunications System (UMTS). However, in other examples, the communication system can be representative of other systems, such as a fiber optic communication system, a free space optical (FSO) communication system, a wired communication system (e.g., a cable (or wire) communication system), etc.

The communication system 100 includes a transmitter 102 and a receiver 104. In some examples, the transmitter 102 and/or the receiver 104 can be located at a respective base station, a portable device (e.g., cellular device, tablet, etc.) or at a device or system configured for processing (e.g., encoding and/or decoding) of information for polar encoding and/or decoding. Thus, in an example, the base station can be used to communicate with another base station or a mobile device; and the base station can be a Base Transceiver Station (BTS) in the 5G cellular system, the GSM system, the CDMA system, an NB (e.g., NodeB) in the WCDMA system, an eNB or eNodeB (e.g., Evolutional Node B) in the LTE system and gNodeB in 5G NR system, a relay station, an access point, a base station device or in a future cellular network technology. The transmitter 102 can be configured to communicate transmission data to the receiver 104 over a channel 106. The transmission data can characterize information that has been encoded using polar codes. The channel 106 can include an air medium for radio communications, copper cable for wired communications, and fiber cable for fiber-optic communications. Thus, in some examples, the channel 106 can be representative of a noisy communication channel.

Due to noise present in the communication medium (e.g., the channel 106), as the transmission data propagates through the communication medium (e.g., as a radio-frequency (RF) signal), the transmission data can become corrupted. Thereby, the channel 106 can distort the transmission data with the noise, such that errors are introduced into the transmission data. For example, the channel 106 can add to the transmission data additive white Gaussian noise (AWGN), co-channel interference (CCI), deep fading, impulsive noise, inter-symbol interference (ISI), nonlinear interference (NLI) due to Kerr effect and/or linear chromatic dispersion (CD). To provide reliable data transmission between the transmitter 102 and the receiver 104, a forward error correction (FEC), such as polar codes can be implemented by the communication system 100. A polar code is a type of linear block error correction code (ECC). As described herein, the transmitter 102 can be configured to encode data based on a polar code, such that errors in the transmission data can be corrected and/or detected by the receiver 104. Thus, the transmitter 102 can be configured to encode blocks of data using the polar code to mitigate transmission errors that can be caused by the noisy channel 106.

To provide for polar encoding, the transmitter 102 can employ a polar encoder 108. The polar encoder 108 can be implemented in hardware or software that can be executed by a processor, firmware, or any combination thereof. If implemented in software and executed by a processor, the functions of the polar encoder 108 and/or at least some of its various sub-components can be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform polar encoding, as described herein.

The polar encoder 108 can be configured to receive or retrieve input data 110. The input data 110 can be provided (e.g., generated) by another device or system that can be in communication with the transmitter 102. In an example, the input data 110 can characterize content, such as a communication, voice, video, packet data, messaging, gaming, broadcast, etc. The input data 110 can be represented as a sequence of informational bits (e.g., a series of 1s and 0s that collectively form or define the input data 110). In some examples, the input data 110 can be referred to message data (or simply as a message). The polar encoder 108 can be configured to process (e.g., encode) the input data 110 and generate a codeword of length $N=2^m$ based on the informational bits, wherein N is a length of the codeword (e.g., a block code length) and m denotes a Kronecker product. Thus, the polar encoder 108 can be configured to encode the input data 110 based on the polar code into a given number of blocks of N size. In some examples, the polar encoder 108 is a 16-bit polar encoder and can be configured to generate a 16-bit length code word, wherein N=16 and m=4. However, in other examples, the polar encoder 108 can be configured as an N-bit polar and can be configured to encode the input data 110 to provide N-bit length codewords. For instance, in examples, wherein the polar encoder 108 is configured as a 512-bit polar encoder, 512-bit length codewords can be generated by the polar encoder 108.

By way of example, the polar encoder 108 can be configured to divide the informational bits characterizing the input data 110 into groups of k informational bits corresponding to messages of a fixed size, wherein k is a number of informational bits in a respective message corresponding to the fixed size. The polar encoder 108 can be configured to process each of the messages and represent each message as input vector $d=[d_0 \ldots d_{15}]$. The input vector d can consist of k informational bits and N–k frozen bits. Each of the bits of the input vector d can have an associated bits location referred to as a bit index. For example, $d_0$ can be designated as bit index 0, $d_1$ can be designated as bit index 1, $d_2$ can be designated as bit index 2, etc. Since polar codes can achieve channel polarization, each of the channels (e.g., bit indexes) can present a different reliability from each other.

Channels that can have a high level of reliability (referred to as noiseless channels) can be employed by the polar encoder 108 for transmission of the informational bits. For examples, if bit positions 3, 5, 6 and 7 of the input vector d are noiseless channels, the polar encoder 108 can use these channels for communicating the informational bits of each message (e.g., to the receiver 104). Channels that can have a lower level of reliability (referred to as pure-noise channels) can be set by the polar encoder 108 to a fixed bit. For examples, if bit positions 0, 1, 2, 4 and 8-15 of the input vector d are noisy channels, the polar encoder 108 can be configured to set these channels to a frozen bit (e.g., bit data 0). Thus, in some examples, the input vector d can consist of frozen bits at bit indexes 0, 1, 2, 4 and 8-15 and remaining bit indexes of the input vector d can be employed for carrying the respective message represented as informational bits.

In some examples, the polar encoder 108 can be configured to employ frozen bit data 112 to identify each bit index of the input vector d that is to be a frozen bit. In other examples, a different technique can be used for setting the noisy channel than the frozen bit data 112. The frozen bit data 112 can characterize at least one bit index (e.g., location) in the input vector d that has been determined as a pure noise channel and thus is to carry a fixed value (e.g., arbitrary data). The remaining bit indexes that are not frozen (e.g., the k informational bits) can be used for carrying a message. Thus, bit-channels (e.g., bit indexes) having a lower probability of error (e.g., a higher level of reliability), such as the noiseless channels, can be used to transmit a respective message, while other bit-channels are "frozen," e.g., used to transmit the frozen bits. The frozen bit data 112 can be provided to the transmitter 102 based on user input (e.g., at a user input device, such as a computer). In some examples, the transmitter 102 can be configured to evaluate the channels and identify the noisy channels and noiseless channels. In additional or alternative examples, the receiver 104 can be provided the frozen bit data 112 and employ the frozen bit data 112 for decoding of polar encoded codewords, as described herein. Thus, since both the transmitter 102 and the receiver 104 know which bit-channels are frozen, arbitrary data can be allocated to the frozen bit-channels. For example, all frozen bits can be assigned "0" or "1".

Figures 2, 3:
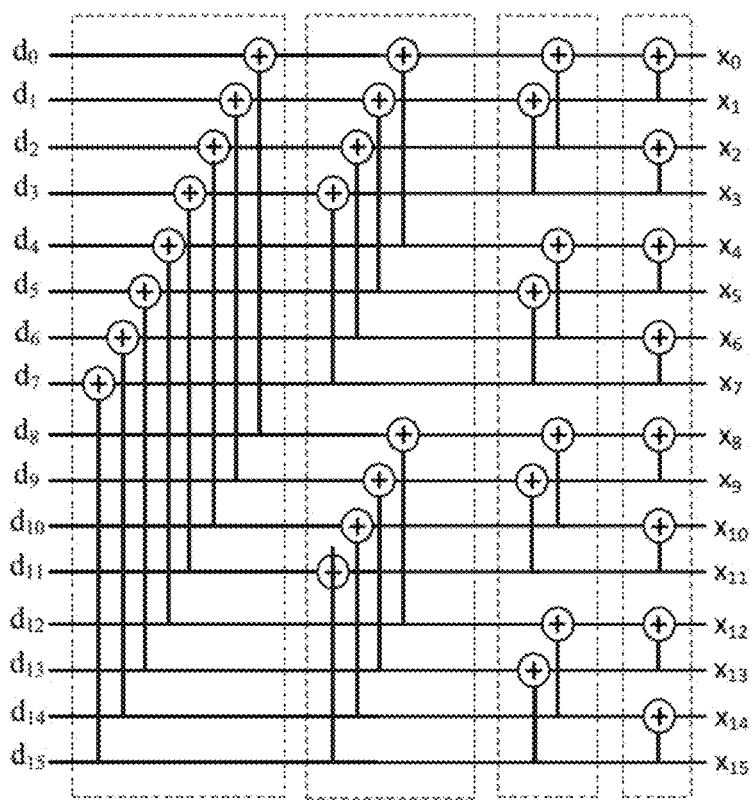
FIG. 2 illustrates an example of a $G_2^{\otimes 3}$ generator matrix.
FIG. 3 illustrates an example of a graphical representation of a $G_2^{\otimes 4}$ generator matrix.

In some examples, the polar encoder 108 can be configured to apply the input vector d to a generator matrix. The generator matrix can be representative of a Kronecker product matrix $G_2^{\otimes m}$, wherein $\otimes m$ denotes the nth Kronecker power. In some examples, the generator matrix is a $G_2^{\otimes 3}$. FIG. 2 illustrates an example of a $G_2^{\otimes 3}$ generator matrix 200. In other examples, a different order generator matrix can be employed, such as a $G_2^{\otimes 4}$ generator matrix, based on a vector length of the input vector d. Thus, in other examples, an m-folded Kronecker product matrix $G_2^{\otimes m}$ can be used. FIG. 3 illustrates an example of a graphical representation of a $G_2^{\otimes 4}$ generator matrix 300. The matrix 300 can include a plurality of encoding stages, such as first encoding stage, a second encoding stage, and a third encoding stage (each stage in the example of FIG. 3 being indicated by dashed lines). The matrix 300 can be implemented by the polar encoder 108 and encode the input vector $d=[d_0 \ldots d_{15}]$ to provide a codeword represented as vector $x=[x_0 \ldots x_{15}]$. In some examples, the matrix 300 can be implemented based on modulo 2 arithmetic. The circles with the "+" symbol in the matrix 300 can represent modulo 2 addition. As illustrated in FIG. 3, the input vector $d=[d_0 \ldots d_{15}]$ can be provided at a left-hand side of the matrix 300 to the first encoding stage. The polar encoder 108 can be configured to encode the input vector $d=[d_0 \ldots d_{15}]$ according to the plurality of encoding stages and output the vector $x=[x_0 \ldots x_{15}]$ at a right-side of the matrix 300. Thus, the polar encoder 108 can be configured to apply (e.g., multiply) the input vector $d=[d_0 \ldots d_{15}]$ to the generator matrix (e.g., the $G_2^{\otimes 4}$ generator matrix) to produce encoded data 114, as illustrated in FIG. 1. The encoded data 114 can represent a codeword vector $x=[x_0 \ldots x_{15}]$. In some examples, the encoded data 114 can be referred to a block in block codes examples.

Continuing with the example of FIG. 1, the codeword vector $x=[x_0 \ldots x_{15}]$ can be provided as the encoded data 114 to a modulator 116. The modulator 116 can be configured to use various digital modulation formats, e.g., quadrature-amplitude modulation (QAM) with and without linear transforms, such as orthogonal frequency-division multiplexing (OFDM) for modulation of the encoded data 114. The modulator 116 can be configured to modulate the encoded data 114 and provide the modulated data 114 to a front end 118. The front end 118 can include electro-optic devices for optical communications and radio-frequency devices for radio communications, in some examples. In additional or other examples, the front end 118 can include signal pre-processing, such as band-pass filter, precoding, power loading, pilot insertion, and pre-distortion. The front end 118 can also include an antenna for outputting the modulated data to the receiver 104 as a transmitted signal corresponding to the transmitted data.

The transmitted data can propagate over the channel 106 to the receiver 104. The receiver 104 can include a front end 120 similar to the front end 118 employed at the transmitter 102. The front end 120 can be configured to sample the transmitted data. A demodulator 122 of the receiver 104 can be configured to demodulate the data samples to recover a version of the codeword vector $x=[x_0 \ldots x_{15}]$ that can be represented as demodulated encoded data 124. Since codeword vector $x=[x_0 \ldots x_{15}]$ was transmitted over the channel 106 and due to channel effects, such as noise, the received codeword vector x may not be identical to the transmitted codeword vector $x=[x_0 \ldots x_{15}]$, and can be represented as codeword vector $\hat{x}=[\hat{x}_0 \ldots \hat{x}_{15}]$, wherein the hat operator indicates that the vector is a received codeword vector.

To decode the polar encoded codeword vector $\hat{x}=[\hat{x}_0 \ldots \hat{x}_{15}]$, the receiver 104 can employ a polar decoder 126. The polar decoder 126 can be configured to decode the received codeword vector $\hat{x}$ to recover the message embedded in the codeword vector $\hat{x}$ represented as decoded data 128 in FIG. 1. Although the polar decoder 126 herein is described with respect to the communication system 100, in other examples, the polar decoder 126 can be employed in any current and future technologies that uses polar decoding techniques (e.g., vehicle-to-everything (V2X) technology). The polar decoder 126 can be configured to recover each message and combine the recovered messages to provide the input data 110 provided to or received at the transmitter 102. Thus, the polar decoder 126 can be configured to decode the codeword vector $\hat{x}$ to determine the informational bits corresponding to the message in the original input vector d. For example, the polar decoder 126 can be configured to recover the informational bits at bit indexes (e.g., locations) that where not set to fixed bits at the transmitter 102, such as bit indexes 0, 1, 2 and 4, as described herein, in some examples, at least based on the frozen bit data 112.

In some examples, the polar decoder 126 can be implemented as a combination of polar hardware components and machine readable instructions. The machine readable instructions can correspond to polar decoding instructions and can be stored in or on a storage medium. The polar hardware components can be employed on a generic vector processor, such as a vector processor 130. As such, in some examples, the vector processor 130 can be configured as a polar decoder vector processor that can implement polar decoding of polar coded N-bit codewords based on the polar decoding instructions. Once executed, the polar decoding instructions can be configured to cause the vector processor 130 to implement vectorized polar decoding via the polar hardware components. The polar decoding instructions can be employed to control the polar hardware components to implement polar decoding. The storage medium can be representative of a non-volatile data storage, such as a hard disk drive, a solid-state drive, flash memory, etc. In some examples, the storage medium can be representative of volatile memory, such as random-access memory (RAM) (e.g., dynamic and static RAM devices) or read-only memory (ROM). In some examples, the polar decoding instructions can include at least some vector instructions to implement vectorized decoding of the codeword vector $\hat{x}$. The polar decoding instructions once executed can cause the polar hardware components on the vector processor 130 to implement polar decoding of the codeword vector $\hat{x}$. Thus, the vector processor 130 can be configured to provide the decoded data 128 corresponding to input data 110 at the transmitter 102 based on the polar decoding instructions.

By way of example, the polar decoder 126 (e.g., the polar decoding instructions) can be configured to control the vector processor 130 (e.g., the polar hardware components implemented thereon) to perform (e.g., carry out) polar decoding of polar encoded data corresponding to codeword vector $\hat{x}$. The polar decoder 126 can be configured to the vector processor 130 to receive a stream of instructions corresponding to polar decoding instructions. The stream of instructions can include scalar and vector instructions. Thus, in some examples, the vector processor 130 can support a vector instruction set and/or a scalar instruction set (e.g., a Reduced Instruction Set Computer (RISC)). As such, the polar decoding instructions can include both scalar and vector instructions. The vector processor 130 can be configured to process the stream of instructions (e.g., by sorting the instructions into respective scalar and vector instructions) and supply respective instructions along instruction lines to the polar hardware components to implement polar decoding of the polar encoded data on the vector processor 130.

Figure 7:
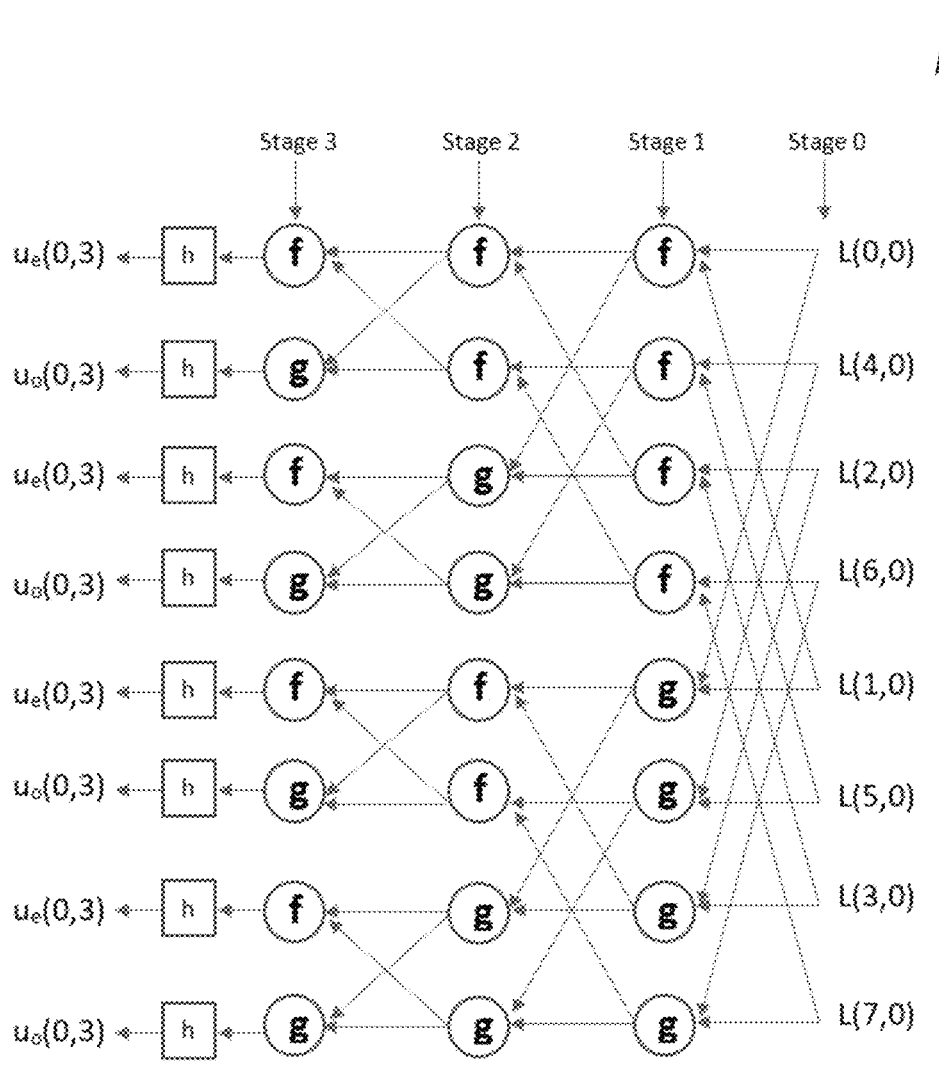
FIG. 7 illustrates an example of a decoding graph for a component decoder.

During each bit estimation (e.g., of the input vector d), a plurality of paths can be caused to be evaluated by the vector processor 130, such as a first path which can estimate the bit as a "0" and a second path which can estimate the bit as a "1" for a given bit at a bit index of the codeword vector $\hat{x}=[\hat{x}_0 \ldots \hat{x}_{15}]$. Every time an information bit (e.g., $d_0 \ldots d_{15}$) is estimated by the vector processor 130 in response to the polar decoder 126, both possible values 0 and 1 can be investigated and 2L paths can be created by the vector processor 130. Therefore, at each bit estimation, the number of codeword paths can double, until a list size L is reached. The list size L can be set or defined by the polar decoder 126. Each path can contain information on a likelihood of the path being the correct codeword. In some examples, the polar decoder 126 can be configured to cause the vector processor 130 to implement a successive cancellation list (SCL) decoding of the polar encoded data (e.g., the codeword vector $\hat{x}=[\hat{x}_0 \ldots \hat{x}_{15}]$) with a list size of 4 (e.g., L=4) according to a decoding graph (e.g., a decoding graph 700, as illustrated in FIG. 7). In other examples, a different list size can be used to implement SCL decoding.

The polar decoder 126 can be configured to cause the vector processor 130 to implement P number of component decoders for bit estimation based on the decoding graph, wherein P is an integer that is an even integer and greater than or equal to two. The vector processor 130 can be configured to implement vector arithmetic operations that can be representative of a set of SCL parallel decoders (e.g., component decoders). Each component decoder can be configured to decode a polar code of a block size of $N_P$=N/P based on the decoding graph, wherein $N_P$ is a block size for each component decoder, N is block size of the codeword vector and P is a number of component decoders. By employing the set of component decoders, the polar decoder 126 can be configured to cause the vector processor 130 to decode 2 bits in parallel (e.g., decode bit $\hat{x}_0$ in parallel with $\hat{x}_1$, $\hat{x}_2$ in parallel with $\hat{x}_3$, etc.) over an λ+1 number of stages of the decoding graph, wherein λ is computed according to $λ=\log_2 N_P$. Thus, the number of stages λ in the decoding graph for the component decoders can be based on the block size of a respective component decoder.

By way of further example, the polar decoder 126 can be configured to cause the vector processor 130 to configure memory locations for storing vectors, such as the vector $\hat{x}=[\hat{x}_0 \ldots \hat{x}_{15}]$ in a vector memory of the vector processor 130. The polar decoder 126 can be configured to provide the vector processor 130 with memory arrangement instructions (e.g., data) for storing in the vector memory the vectors and/or results of operations performed by the polar hardware components at each stage of the decoding graph based on the polar decoding instructions. The memory arrangement data can identify addresses (or memory elements) for storing the vectors and/or the results of the operations (e.g., calculations). The calculations can include bits (or bytes) representative of logarithmic likelihood ratios (LLR) values, even bit values and/or odd bit values that can be outputted at each node of the decoding graph. The calculations, such as for a respective node at a given stage, can be stored in the vector memory in a vector form based on addresses assigned for memory elements in the vector memory.

Thus, the memory arrangement instructions once executed by the vector processor 130 can implement buffers for storing generated values based on the decoding graph. The memory arrangement instructions can specify an ordering for storing generated values in the vector memory, such as during the given stage of the decoding graph. As such, the memory arrangement instructions can include instructions that logically define (e.g., partition) a storage buffer for each of the LLR, even and/or odd bit calculations generated during each stage of the decoding graph, such as an LLR buffer, even bit buffer and odd bit buffer. The polar decoder 126 can be configured to cause the vector processor 130 to store respective LLR, even and bit calculations (e.g., values) as vector data in a corresponding buffer of the vector memory during each stage of the decoding graph. Each of the buffers can be organized as a two-dimensional array that can have $N_P$ rows and each row can have 2LP memory elements (e.g., memory locations), as defined by the memory arrangement instructions.

In some examples, the polar decoder 126 can be configured to cause state registers of the vector processor 130 to be employed for vector state information, such as to enable copying of LLR and bit values. The polar decoder 126 can be configured to cause the state registers to be accessed to control reading and writing of the memory elements in the vector memory for the buffers. The state registers can include a list-to-buffer mapping state register for the LLR buffer and for the even bit buffer. In some examples, the polar decoding instructions can include instructions for implementing the list-to-buffer mapping state register in the state registers of the vector processor 130. The list-to-buffer mapping state register for the LLR buffer and the even bit buffer can be manipulated according to the examples described herein to avoid computationally expensive LLR and bit memory copy operations to implement polar decoding in contrast to other approaches. By way of example, the list-to-buffer mapping state register can be a (λ+1) by L matrix and each mapping element of the matrix can be represented by log 2(L) bits (e.g., by 2 bits). In the examples herein, the list-to-buffer mapping state register is a 4×4 matrix with a list size of 4 (e.g., L=4 and $N_P$=8) and can be employed by the vector processor 130 to implement polar decoding. However, in other examples, a different matrix having different dimensional characteristics can be employed to implement polar decoding.

In further examples, each mapping element (e.g., value) of the list-to-buffer mapping state register for the LLR buffer and the even bit buffer can be associated with (e.g., mapped to) a group of memory elements of the LLR buffer or the even bit buffer for a given path. As such, each mapping element of list-to-buffer mapping state register at the given stage of the decoding graph can correspond to memory elements of the LLR buffer and/or the even bit buffer for the given path. Accordingly, each mapping element of the list-to-buffer mapping state register for the LLR buffer and the even bit buffer can correspond to one stage of one path according to a list size for the LLR buffer or the even bit buffer.

The polar decoder 126 can be configured to employ the list-to-buffer mapping state register for the LLR buffer and the even bit buffer to determine which memory locations needs to be read from for loading LLR calculations or even bit calculations at the given stage of the decoding graph. As such, each mapping element (e.g., value) of the list-to-buffer mapping state register can be indicative of which buffer (e.g., memory locations) needs to be read from for loading LLR computations during LLR update iterations or which bit buffer (e.g., memory locations) that needs to be read from for loading even bit values for bit update iterations. Following each LLR and bit update iteration at the given stage of the decoding graph, the list-to-buffer mapping state register for the LLR buffer and/or the even bit buffer can be reset. Accordingly, by manipulating the list-to-buffer mapping state register explicit computationally expensive manipulations of the LLR buffer and the even bit buffer can be directly avoided.

In some examples, the polar decoder 126 can cause the vector processor 130 to load into respective vector registers the polar encoded data. For example, polar decoding instructions that include vector load instructions can be provided to the vector processor 130 to implement loading of the polar encoded data into the respective vector registers. The polar decoding instructions can be configured to control the vector processor 130, such that the component decoders implemented thereon carry out or perform polar decoding of a given set of bits of vector x̂. Each of the component decoders can be configured to decode bits of vector x̂ based on decoding sequencing data that can be provided by the polar decoder 126. The decoding sequencing data can characterize the decoding graph for each respective component decoder. Each component decoder can be configured to decode the given set of bits of vector x̂ based on the decoding graph to estimate the transmitted bits. Thus, the polar decoder 126 can be configured to cause the vector processor 130 to implement the decoding graph to decode the given set of bits of vector x̂ to estimate a given set of bits of vector d.

In some examples, the decoding graph can include 4 stages: Stage 0, Stage 1, Stage 2, and Stage 3 (e.g., $\lambda=3$ for $N_P=8$). Stages 1-3 can include a set of f and g computation nodes. As described herein, each of the f and g computation nodes can compute a new LLR based on prior computed LLRs. The decoding graph can further include at an output of the f and g computations at Stage 3 a decision unit that can be representative of a hard decision block. Each hard decision block can be configured to make a hard decision based on an LLR value outputted from a corresponding f and g node at Stage 3. Thus, based on the LLR values outputted at Stage 3, the hard decision block can make a hard decision and output an estimate bit value $u_i$, wherein i indicates a bit index for a bit in the vector u.

To decode the given set of bits of vector x̂, the polar decoder 126 can be configured to implement LLR update iterations (e.g., recursions) at each stage along the decoding graph in a first direction along the decoding graph based on the list-to-buffer mapping state register for the LLR buffer. For example, the polar decoding instructions can be configured to cause the vector processor 130 to receive LLR update instructions for a given bit index (e.g., the bit that is to be decoded). The computation instructions can specify a number of f or g computations corresponding to a number of LLR update iterations that is to be performed by the vector processor 130 on which the component decoders are implemented. The LLR update instructions can cause LLR values to be loaded from the LLR buffer into the vector registers for LLR computations by the component decoders based on the list-to-buffer mapping state register for the LLR buffer. For example, the LLR values can be loaded as input vectors of LLR values into the vector registers and the polar hardware components can be configured to retrieve the input vector of LLR values for computations. In some examples, at least one input vector of LLR values can be shuffled based on the list-to-buffer mapping state register at the given stage. In response to shuffling the at least one input vector of LLR values, the input vectors of LLR values can be provided to the polar hardware components.

The polar hardware components can be configured to implement at least one f and g computation at the given stage of the decoding graph based on the polar decoding instructions (e.g., in response to the polar decoder 126) based on the input vectors. In some examples, the polar hardware components can be configured to implement at least one f-computation at the given stage of the decoding graph for LLR update iteration based on the decoding instructions. In other examples, the polar decoding instructions can be configured to cause the polar hardware components to implement at least one g-computation at the given stage of the decoding graph for LLR update iteration. In response to computing the LLR values, these computed LLR values can be loaded and the polar hardware components can be configured to implement an f-computation at the f-computation node at another stage of the decoding graph. As such, the LLRs at each stage can be updated based on prior computed LLRs, and the updated values can be stored in the LLR buffer in vector form. In response to computing an LLR at Stage 3, the polar hardware components implementing the component decoders can be configured to apply a hard decision to the computed LLR to output the estimate bit value $u_i$.

In some examples, to decode the given set of bits of vector x̂, the polar decoder 126 can be configured to implement bit update iterations (e.g., recursions) at each stage along the decoding graph in a second direction. The polar decoder 126 can be configured to cause the vector processor 130 to receive bit update instructions specifying that a bit update is to be implemented by the polar decoder 402. The bit update instructions can cause input vectors of bit values to be loaded from the even and odd bit buffers into the vector registers for bit computations by the polar hardware components implementing the component decoders.

The bit values can be loaded as input vectors of bit values into the vector registers and the polar hardware components can be configured to retrieve the input vectors of bit values for computations. In some examples, at least one input vector of even bit values from the even bit buffer can be shuffled based on the list-to-buffer mapping state register for the even bit buffer at the given stage. In response to shuffling the at least one input vector of even bit values, the polar hardware components can be configured to implement at least one bit update computation at the given stage of the decoding graph based on the input vectors of bit values. In some examples, the polar decoder 126 can be configured to cause the vector processor 130 to skip bit update recursion for even bit indexes for the estimate bit values $u_i$. The polar decoder 126 can be configured to implement bit shuffling for the input even bit buffer to estimate bit values $u_i$, as described herein.

By way of example, during each LLR and bit update iteration, as described herein, the polar decoder 126 can be configured to cause the vector processor 130 to kill and clone paths by manipulating the list-to-buffer mapping state register for the LLR buffer and the even bit buffer for each LLR and bit update iteration, respectively. In contrast to other approaches, when a path is killed (e.g., pruned), the LLR and bit memory needs to freed and allocated to a new path, and when a path is cloned, LLR and bit memory are copied to the LLR and bit memory allocated for the new path. However, cloning of the new path takes many computer cycles to implement. Instead, the polar decoder 126 can be configured to cause the vector processor 130 to kill and clone paths by manipulating the list-to-buffer mapping state register for the LLR buffer and the even bit buffer rather than manipulating the LLR or the bit memory (e.g., directly) as in the other approaches. Column copy functionality being implemented by the vector processor 130 in response to the polar decoder 126 can be equivalent to kill and cloning path. Thus, the vector processor 130 can be configured to in response to the polar decoder 126 to manipulate the list-to-buffer mapping state register to kill and clone paths. The polar decoder 126 can be configured to cause the vector processor 130 to copy a given column to another column of the list-to-buffer mapping state register for the LLR buffer and/or the even bit buffer at the given stage. For example, the polar decoder 126 can be configured to vector processor 130 to use the LLRs or bit values in a corresponding buffer associated with the given column for the f-or-g LLR update or bit update computations at polar hardware components implementing the component decoders.

As described herein, the polar decoder 126 can be configured to cause the vector processor 130 to employ the list-to-buffer mapping state register for the LLR buffer to shuffle input vectors of LLRs into the vector registers. The polar decoder 126 can be configured to cause the vector processor 130 to shuffle the input vectors of LLRs in response to copying a given column to another column of the list-to-buffer mapping state register for the LLR buffer at the given stage during a given LLR update iteration. For example, the polar decoder 126 can be configured to cause the vector processor 130 to use a version of the list-to-buffer mapping state register for the LLR buffer that has at least one copied column to shuffle the input vectors of LLRs for the g-computations and f-computations at the given stage (e.g., Stage 2). The polar hardware components implementing the component decoders can be configured to retrieve or receive the shuffled input vectors of LLRs and implement LLR updates according to the examples herein. As explained herein, once LLR updates for the given stage of the decoding graph have been completed, elements of the copied columns can be reset (e.g., set) to the original path index state for another stage of the decoding graph.

By way of further example, the polar decoder 126 can be configured to cause the vector processor 130 to shuffle the input vectors of the LLRs into the vector registers based on a sequence of values of elements of a corresponding row of the list-to-buffer mapping state register for the LLR buffer. The polar decoder 126 can be configured to cause the vector processor 130 to shuffle the input vectors of the LLRs when the decoding graph is at the given stage into the vector registers based on the sequence of values of the elements in the corresponding row of the list-to-buffer mapping state register. Accordingly, the polar decoder 126 can be configured to cause the vector processor 130 to shuffle the input vectors of the LLRs into the vector registers based on a row pattern for a given stage for use during the f-computation at the polar hardware components implementing the component decoders, as described herein.

In even further examples, the polar decoder 126 can be configured to cause the vector processor 130 to employ the list-to-buffer mapping state register for the even bit buffer to shuffle input vectors of even bits from the even bit buffer into the vector registers. The polar decoder 126 can be configured to cause the vector processor 130 to shuffle the input vectors of even bits in response to copying a given column to another column of the list-to-buffer mapping state register for the even bit buffer at the given stage during the given bit update iteration. For example, the polar decoder 126 can be configured to cause the vector processor 130 to use a version of a list-to-buffer mapping state register for the even bit buffer that has at least one copied column to shuffle the input vectors of even bits for bit computations (e.g., by performing modulo 2 arithmetic) at the given stage. As described herein, the bit computations can be performed by the polar hardware components implementing the component decoders. The polar hardware components can be configured to retrieve or receive the shuffled input vectors of even bits and implement a bit update recursion according to the examples herein. As explained herein, once bit updates for the given stage of the decoding graph have been completed, the polar decoder 126 can be configured to cause elements of the copied columns can be reset (e.g., set) to the original path index state for another stage of the decoding graph.

In additional examples, the polar decoder 126 can be configured to cause the vector processor 130 to shuffle the input vectors of the even bits into the vector registers based on a sequence of values of elements of a corresponding row of the list-to-buffer mapping state register for the even bit buffer. The polar decoder 126 can be configured to cause the vector processor 130 to shuffle the input vectors of even bits when the decoding graph is at the given stage into the vector registers based on the sequence of values of the elements in the second row of the list-to-buffer mapping state register for the even bit buffer. Accordingly, the polar decoder 126 can be configured to cause the vector processor 130 to shuffle the input vectors of the even bits into the vector registers based on a row pattern for a given stage for use during the bit computations at the polar hardware components implementing the component decoders, as described herein.

In further examples, the polar decoder 126 can be configured to cause the vector processor 130 to evaluate each path for each stage, such that only L paths can be allowed to survive among the L×2P paths generated by the polar decoder 126, wherein P is a number of component decoders. A path metric (PM) value can be used to determine which of the L candidate paths can survive. The PM value can be indicative of a likelihood of a path being a correct codeword. The polar decoder 126 can be configured to cause the vector processor 130 to compute for each node the PM. The PM value at each node can correspond to a local metric from a root node to the current node. The polar decoder 126 can be configured to cause the vector processor 130 to search the paths to find the length-n path with a largest metric as an updated survival path, thereby pruning a number of paths during each stage.

As such, by implementing the polar decoder 126 in a vector processing environment (e.g., the vector processor 130) with the list-to-buffer mapping state register for the LLR buffer and the even bit buffer explicit memory copy and memory allocation (e.g., freeing) can be avoided. As such, explicit memory copy and memory allocation and freeing can be mitigated. Consequently, a throughput of the decoding graph (e.g., a SCL decoding algorithm) can be improved by vectoring all steps of the decoding graph and improving a performance of the polar decoder overall. Accordingly, the polar decoder can be implemented on a general purpose vector processor rather than a chip with fixed hardware.

Figure 4:
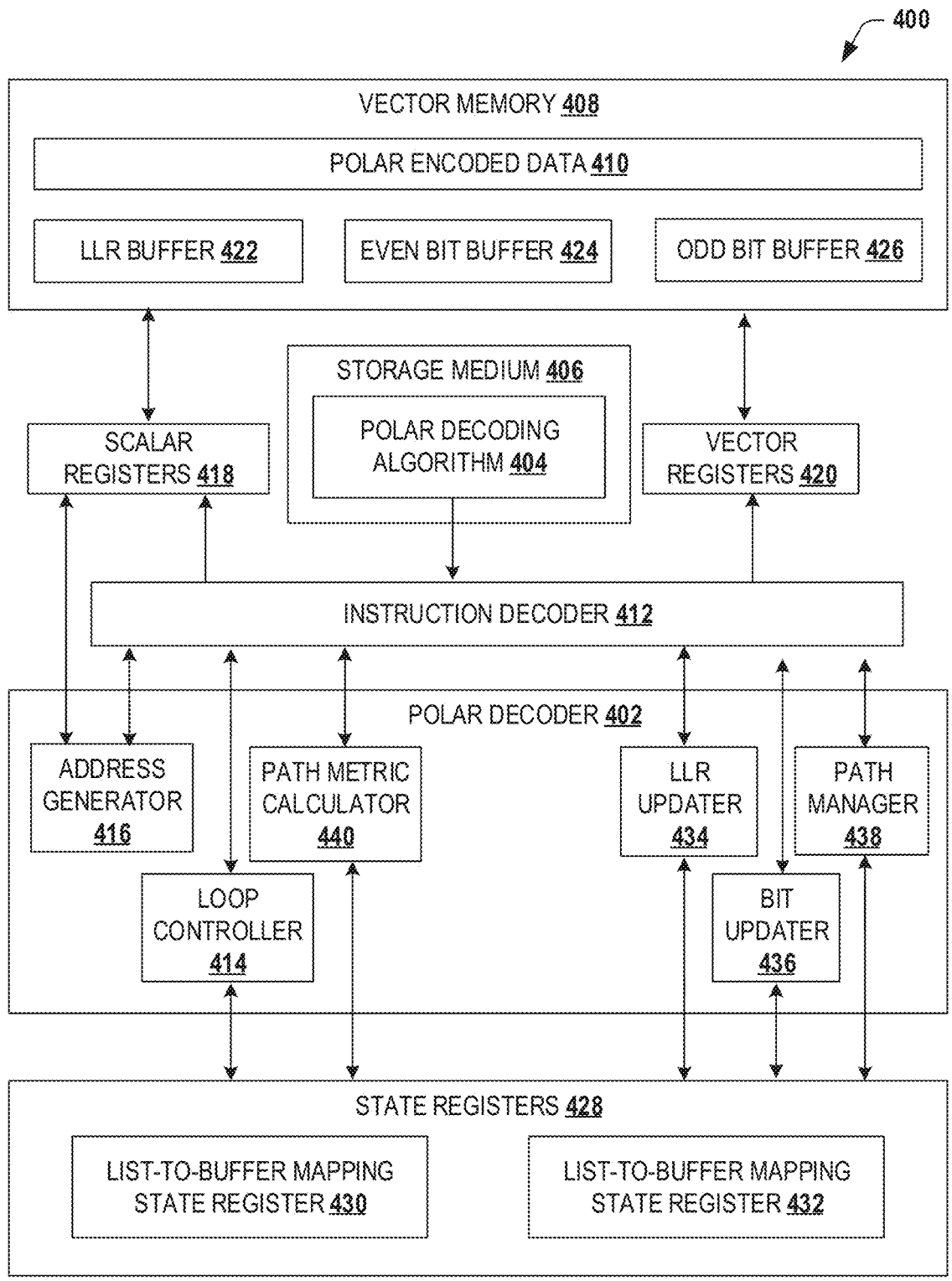
FIG. 4 illustrates an example of a vector processor for decoding polar encoded codewords.

FIG. 4 illustrates an example of a vector processor 400 for decoding polar encoded codewords. The vector processor 400 can be representative of a general purpose signal processing device that has been configured to implement decoding of polar encoded codewords. In some examples, the vector processor 400 corresponds to the vector processor 130, as illustrated in FIG. 1. Therefore, reference can be made to the example of FIGS. 1-3 in the following description of the example of FIG. 4. As such, the vector processor 400 can be implemented on a receiver, such as the receiver 104, as illustrated in FIG. 1. As illustrated in FIG. 4, the vector processor 400 can be configured with a polar decoder 402. The polar decoder 402 can be implemented as a set of hardware components that can correspond to the polar hardware components of the polar decoder 126, as illustrated in FIG. 1. Thus, the polar decoder 402 can be configured on a generic vector processor, such as the vector processor 400, to transform the vector processor 400 into a polar decoder vector processor that can implement polar decoding of polar coded N-bit codewords based on a polar decoding algorithm 404 stored at a storage medium 406.

The vector processor 400 can be coupled to (e.g., via a bus) to the storage medium 406. In some examples, the storage medium 406 can be part of the vector processor 400 while in other examples the storage medium 406 can be external to the vector processor 400. The storage medium 406 can be representative of a non-volatile data storage, such as a hard disk drive, a solid-state drive, flash memory, etc. In some examples, the polar decoding algorithm 406 can be representative of the polar decoding instructions that form the polar decoder 126, as illustrated in FIG. 1. As such, the polar decoding algorithm 406 can be representative of machine readable instructions corresponding to polar decoding instructions that can be read and executed to implement polar decoding by or at the vector processor 400. The polar decoding instructions once executed by the vector processor 400 can carry out at least a portion of the functionality described herein, such as decoding of polar encoded codewords.

In some examples, the vector processor 400 can further include vector memory 408. The vector memory 408 can be accessed and loaded with polar encoded data 410. In an example, the polar encoded data 410 can correspond to the demodulated encoded data 124, as illustrated in FIG. 1. In other examples, the vector processor 400 can be configured to retrieve the polar encoded data 410 and load the polar encoded data 410 into the vector memory 408. The polar encoded data 410 can be representative of a received codeword vector. Thus, the polar encoded data 410 can be representative of the codeword vector $\hat{x}$. The polar encoded data 410 can be stored in an array form in the vector memory 408 for retrieval and processing by vector processor 400. Thus, the polar encoded data 410 can be stored in the vector memory 408 as an array.

In some examples, the polar encoded data 410 can be stored in the vector memory 408 as a one-dimensional array corresponding the codeword vector f. The polar encoded data 410 can characterize one or more messages corresponding to codewords of N length, wherein N is a length of a block size. As described herein, each message can include a number of informational bits (e.g., data carrying bits) and fixed bits (e.g., non-data carrying bits). In the examples herein, the vector processor 400 is described herein as implementing a 16-bit polar decoder, however, in other examples, the vector processor 400 can be configured to implement any N-bit polar decoder based on a bit polar encoding scheme. The vector processor 400 can be configured to process 16-bit codewords represented by the polar encoded data 410 as a codeword vector $\hat{x}=[\hat{x}_0 \ldots \hat{x}_{15}]$. In other examples, if the messages are encoded using a 512-bit polar encoding scheme, the vector processor 400 can be configured to implement a 512-bit polar decoder for decoding of 512-bit long codewords.

The polar decoder 402 can be configured to employ vector components of the vector processor 400 to implement (e.g., carry out) polar decoding of the polar encoded data 410 based on the polar decoding algorithm 404. As described herein, to implement polar decoding at the vector processor 400, the polar decoder 402 can be configured to implement polar decoding based on a stream of instructions received at an instruction decoder 412 of the vector processor 400. The stream of instructions can correspond to the polar decoding instructions representative of the polar decoding algorithm 404. In some examples, the vector processor 400 can support a vector instruction set and/or a scalar instruction set (e.g., a Reduced Instruction Set Computer (RISC)). As such, the stream of instructions can include both scalar and vector instructions. The instruction decoder 412 can be configured to process the stream of instructions (e.g., by sorting the instructions into respective scalar and vector instructions) and supply respective instructions along instruction lines to the polar hardware components of the polar decoder 402 to implement polar decoding of the polar encoded data 410 on the vector processor 400.

By way of further example, the polar decoder 402 can be configured to implement 16-bit polar decoding based on the polar decoding instructions. In some examples, the polar decoder 402 can be configured to implement a successive cancellation list (SCL) parallel decoding scheme according to the polar decoding algorithm 404. The vector processor 400 can be configured by the polar decoder 402 to implement parallel polar decoding (e.g., decoding of n-bits in parallel) based on the polar decoding instructions received at the instruction decoder 412. In SCL parallel decoding, the polar decoder 402 can be configured to estimate each bit of a given message (e.g., the vector $d=[d_0 \ldots d_{15}]$).

During each bit estimation, the polar decoder 402 can be configured to generate a plurality of paths, such as a first path which can estimate the bit as a "0" and a second path which can estimate the bit as a "1" for a given bit at a bit index of the codeword vector $\hat{x}=[\hat{x}_0 \ldots \hat{x}_{15}]$. Every time an information bit (e.g., $d_0 \ldots d_{15}$) is estimated by the polar decoder 402, both possible values 0 and 1 can be investigated and 2L paths can be created by the polar decoder 402. Therefore, at each bit estimation, the number of codeword paths can double, until a list size "L" is reached. The list size "L" can be set or defined based on the polar decoding algorithm 404. Each path can contain information on a likelihood of the path being the correct codeword. In the examples described herein, the polar decoder 402 can be configured to implement SCL decoding of the polar encoded data 410 (e.g., the codeword vector $\hat{x}=[\hat{x}_0 \ldots \hat{x}_{15}]$) with a list size of 4 (e.g., L=4). In other examples, a different list size can be used to implement SCL decoding of the polar encoded data 410.

In some examples, the polar decoder 402 can be configured to implement P number of component decoders, wherein P is an integer that is an even integer and greater than or equal to two. Thus, the polar decoding algorithm 404 can configure the polar decoder 402 to implement (e.g., resemble) functions of P number of component decoders. In some examples, P=2, and two component decoders can be implemented by the polar decoder 402. The polar decoder 402 can be configured perform operations (e.g., vector and/or scalar operations) that can be representative of an SCL parallel decoder based on the polar decoding algorithm 404, as described herein. The instruction decoder 412 can be configured to provide instructions to a loop controller 414 indicative of a number of operations to be implemented by the polar decoder 402 to implement polar decoding, as described herein. The operations can be implemented as vector arithmetic operations and can be implemented by the polar decoder 402 to provide a set of SCL parallel decoders.

In some examples, the component decoders can be configured to operate in parallel to implement an SCL parallel decoder based on the polar decoding instructions. Each component decoder can be configured to decode a polar code of a block size of $N_P=N/P$, wherein $N_P$ is a block size for each component decoder, N is block size of the codeword vector and P is the number of component decoders. Thus, each of the component decoders can be configured decode 8-bits of the codeword vector $\hat{x}=[\hat{x}_0 \ldots \hat{x}_{15}]$. As such, the component decoders can be configured to operate on 8-bits of the message block (e.g., $N_P=16/2=8$) (e.g., at a time). For example, the component decoders can be configured to operate on (e.g., decode) a first set of bits of the vector $\hat{x}$ (e.g., bits $\hat{x}_0 \ldots \hat{x}_7$) and after decoding the first set of bits operate on a second set of bits of the vector $\hat{x}$ (e.g., bits $\hat{x}_8 \ldots \hat{x}_{15}$). By employing two component decoders, the vector processor 400 can be configured to decode 2 bits in parallel (e.g., decode bit $\hat{x}_0$ in parallel with $\hat{x}_1$, $\hat{x}_2$ in parallel with $\hat{x}_3$, etc.) over an $\lambda+1$ number of stages, wherein $\lambda$ is computed according to $\lambda=\log_2 N_P$. Thus, to decode the 16-bit message (e.g., the codeword vector $\hat{x}=[\hat{x}_0 \ldots \hat{x}_{15}]$), the vector processor 400 can be configured to implement SCL decoding over 4 stages (e.g., 3+1=4).

In further examples, the instruction decoder 412 can be configured to receive the polar decoding instructions indicative of memory locations for storing vectors, such as vector $\hat{x}=[\hat{x}_0 \ldots \hat{x}_{15}]$ in the vector memory 408. Thus, the polar decoding instructions can include memory arrangement data for storing in the vector memory 408 the vectors and/or results of operations performed by the polar decoder 402. The memory arrangement data can identify addresses or memory elements (e.g., locations in the vector memory 408) for storing the vectors and/or the results of the operations. The instruction decoder 412 can translate the polar decoding instructions and control an address generator 416 of the polar decoder 402 based on the memory arrangement data. The address generator 416 can be configured to generate addresses for the memory elements in the vector memory 408 that can be used (e.g., accessed) by hardware components (e.g., the loop controller 414) of the polar decoder 402. The address generator 416 can be configured to identify memory elements in the vector memory 408 based on the memory arrangement data for storing vectors, such as the codeword vector $\hat{x}=[\hat{x}_0 \ldots \hat{x}_{15}]$) and calculations generated by the component decoders. Thus, in some examples, a single address can be associated with a single memory element (e.g., memory location) or a plurality of memory elements (e.g., at least two memory locations). The calculations can include bits (or bytes) representative of LLR values, even bit values and odd bit values. The calculations, such as for a given stage, during the SCL decoding process, can be stored in the vector memory 408 in a vector form based on the addressing by the address generator 416 according to the memory arrangement data.

The address generator 416 can be configured to communicate with scalar registers 418 of the vector processor 400 for addressing of the memory elements based on the memory arrangement data. In some examples, at least some of the scalar registers 418 are implemented as 64 bits registers. In other examples, at least some of the scalar registers 418 are implemented as 32 bit registers. At least some of the scalar registers 418 can be used to hold an immediate value, as an index into vector registers 420, as an address for vector memory accesses or for storing results of vector operations in the memory elements. Thus, the scalar registers 418 can be configured to reserve (or specify) memory locations (e.g., addresses) for accessing or storing results of vector operations. Thus, the contents of the scalar registers 418 can be made available to the vector registers 420. In some examples, the scalar registers 418 can include operations that in parallel combine each data element of a vector with a scalar value based on the stream of instructions received at the instruction decoder 412. One instruction, for example, multiplies the data elements of a vector (e.g., in a vector register) by a scalar value.

The vector processor 400 further includes the vector registers 420. Each vector register 420 can have a fixed size and, in some examples, can be partitioned into separate data elements (e.g., bits) of selectable size. Accordingly, the number of data elements stored in the vector registers 420 can depend on the selected size for the elements. For example, a 32-byte register can be divided into thirty two 8-bit data elements, sixteen 16-bit data elements, or eight 32-bit data elements. In some examples, the polar decoding instructions implemented based on the polar decoding algorithm 404 can employ the scalar registers 418 and/or the vector registers 420 as operands and manipulate multiple data elements of the vector registers 420 in parallel to implement polar decoding by the polar decoder 402. Exemplary instructions for the vector processor 400 can include co-processor interface operations; flow control operations; load/store operations, and the logic/arithmetic operations, as described herein. As such, the arithmetic operations (e.g., vector operations) at the polar decoder 402 can include operations which can combine data elements from one vector register 420 with corresponding data elements from one or more other vector registers 420 to generate the data elements of a resulting data vector that can be stored in a different vector register 420 based on the polar decoding instructions. Other arithmetic operations can be employed to mix various data elements from the vector registers 420 or combine data elements from the vector registers 420 with scalar quantities (e.g., stored in the scalar register 418) based on the polar decoding instructions.

As described herein, the address generator 416 can be configured to identify memory elements in the vector memory 408 based on the memory arrangement data for storing calculations generated by the component decoders being implemented by the polar decoder 402. Thus, the memory arrangement data can specify an ordering for storing generated values by the component decoders, such as during the given stage of the SCL decoding process (e.g., the decoding graph) in the vector memory 408. As such, the memory arrangement data can specify how the LLR, even, and odd bits are stored in the vector memory 408. Thus, the memory arrangement data can logically define (e.g., partition) a storage buffer for each of the LLR, even and/or odd bit calculations generated during each stage of the SCL decoding process, such as an LLR buffer 422, an even bit buffer 424 and an odd bit buffer 426. The address generator 416 can be configured to cooperate with the loop controller 414 (and, in some examples, other hardware components of the polar decoder, such as an LLR updater 434 and a bit updater 436), and during each stage of the SCL decoding store respective LLR, even and bit calculations (e.g., values) as vector data in a corresponding buffer of the vector memory 408. Each of the buffers 422-426 can be organized as a two-dimensional array that can have $N_P$ rows and each row can have 2LP memory elements (e.g., memory locations), as defined by the memory arrangement data. In some examples, each row can have 16 memory elements (e.g., 2LP=2×4×2=16). As such, in some examples, each array can be an $N_p$ by 2×L×P matrix, for example, an 8×16 matrix.

Figures 5, 6:
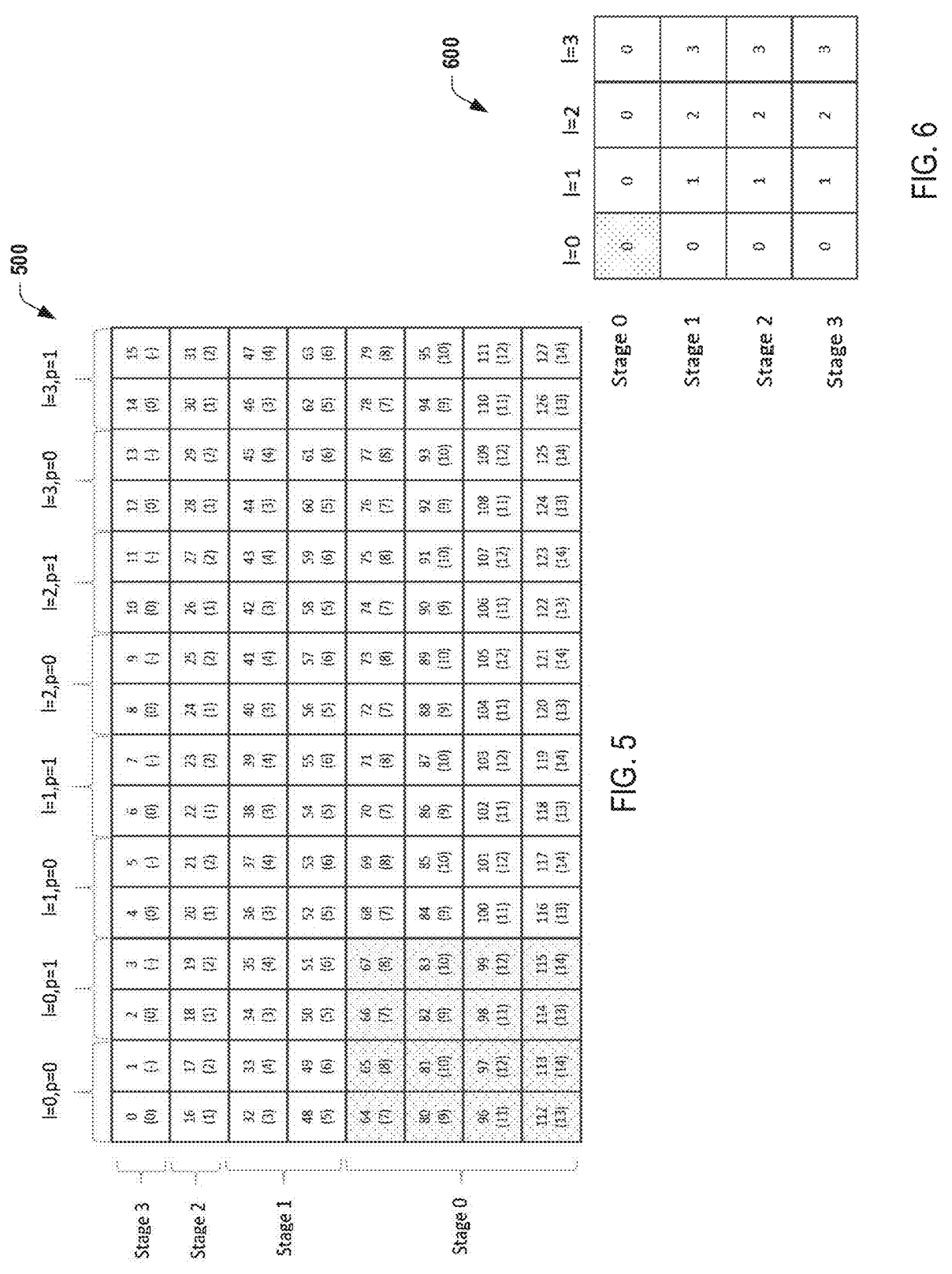

FIG. 5 illustrates an example of an LLR memory arrangement for an LLR buffer 500. The LLR buffer 500 can correspond to the LLR buffer 422, as illustrated in FIG. 4. The LLR memory arrangement can be representative of a memory structuring (e.g., layout) in a vector memory (e.g., the vector memory 408, as illustrated in FIG. 4) of a plurality of elements that can collectively define the LLR buffer 500. The even and odd bit buffers 424, 426 can have a similar memory structuring as the LLR memory arrangement for the LLR buffer 500. As such, the LLR memory arrangement for the LLR buffer 500 can be representative of an even bit memory arrangement for the even bit buffer 424 and odd bit memory arrangement for the odd bit buffer 426.

As illustrated in FIG. 5, the LLR buffer 500 can be organized to store LLR calculations (e.g., values) computed during each LLR update iteration for each stage based on the polar decoding instructions received at an instruction decoder (e.g., the instruction decoder 412, as illustrated in FIG. 4). Each memory element of the LLR buffer 500, as illustrated in FIG. 5, can be representative of a memory location (e.g., a buffer memory) in the vector memory 408 at which computed LLRs for a given LLR update iteration at the given stage can be stored. Each memory element of the LLR buffer 500 can have an associated local memory index (e.g., a memory address) for the LLR buffer in the LLR buffer and an associated component memory index in parenthesis for each component decoder, as illustrated in FIG. 5. An address generator (e.g., the address generator 416, as illustrated in FIG. 4) can be configured to provide the local memory index and the component memory index for each memory element based on the memory arrangement data. Thus, the memory arrangement data can specify addressing for accessing (e.g., storing or retrieving) LLR calculations for the polar decoder 402 to implement polar decoding.

For example, memory element 64 in the LLR buffer 500 can be representative of one or more memory buffers (e.g., locations) in the vector memory 408. The value "64" in context of the LLR buffer can be the local memory index (e.g., address) for the one or more memory buffers, and the value "7" in the parenthesis of memory element 64 can be the local memory index for the first component decoder. Since each component decoder is of size $N_P$=8, each LLR calculation stored by the LLR buffer (e.g., the LLR buffer 422) can be denoted by one byte (e.g., 8 bits). As such, each memory element in the LLR memory arrangement can be representative of 15 bytes (e.g., 120 bits).

By way of further example, the component memory index can be used to derive the address of vector load/store that can be used by the address generator 416. For example, if for a given stage of a decoding graph (e.g., a decoding graph 700, as illustrated in FIG. 7), the LLR at a given node needs to be loaded, the component memory index can be represented as $2^{(3-j)}+i-1$, wherein i and j respectively correspond to the bit index and offstage index of the decoding graph. As an example, the component memory index of L(0,0) can be represented as $2^{(3-0)}+0-1=7$ and L(1,0) can be represented as $2^{(3-0)}+1-1=8$. Since L(0,0) and L(1,0) of all component decoders are loaded as a vector, as described herein, the address offset of vector load can be (7+1)×L×P=8×4×2=64 in the current example. As illustrated in FIG. 5, 64 can correspond to the global address offset for the whole vector of L(0,0) and L(1,0) and in the parenthesis (7), 7 can correspond to the component memory index. In some examples, L(0,0) and L(1,0) can be loaded by the polar decoder 402. The polar decoder 402 can be configured to calculate and save LLR L(0,1) and the component memory index of output LLR would be $2^{(3-1)}+0-1=3$ and the vector address offset can be (3+1)×L×P=4×8=32, such that the vector store address offset can be 32.

In further examples, the LLR buffer 500 can be (e.g., logically) divided into 4 stage sections (e.g., labeled in FIG. 5 as "Stage 0," "Stage 1," "Stage 2," and "Stage 3"), as illustrated in FIG. 5. As such, each row of the LLR buffer 500 can include related LLR calculations for the given stage. For example, as illustrated in FIG. 5, Stage 0 can be associated with 4 rows having a plurality of memory elements (e.g., from memory element 64 to memory element 127) for storing related LLR calculations generated by the polar decoder 402. By way of further example, Stage 2 can be associated with two rows having a plurality of different memory elements (e.g., from memory element 16 to memory element 31) for storing related LLR calculations generated by the polar decoder 402.

Each component decoder can be (e.g., logically) associated with a given number of columns based on the component memory index assigned for memory elements of the given number of columns. As such, because L=4, each component decoder for each path can be associated with two columns by a corresponding memory index. As illustrated in FIG. 5, the first component decoder (e.g., labeled as "p=0") for path 0 (e.g., labeled as "l=0" in FIG. 5) and the second component decoder (e.g., labeled as "p=1") for path 0 (e.g., labeled as "l=0" in FIG. 5) can be associated with the first two respective sets of columns from left to right of the LLR buffer 500. By way of a further example, for path 1 (e.g., labeled as "l=1" in FIG. 5), the first and second component decoders can be associated with a subsequent sets of columns. Accordingly, for each path from l=0 to 3, each of the component decoders can be associated with corresponding columns of the LLR buffer 500 based on the component memory index assigned for the memory elements of a respective column in the LLR buffer 500.

Continuing with the example of FIG. 4, in further examples, the vector processor 400 can include state registers 428. The state registers 428 can be employed by the polar decoder 402 to hold vector state information. The state registers 428 can be accessed during the SCL decoding to control reading and writing of the memory elements in the vector memory 408. The state registers 428 can include a list-to-buffer mapping state register 430 for the LLR buffer 422 and a list-to-buffer mapping state register 432 for the even bit buffer 424. In some examples, instruction decoder 412 can be configured to receive polar decoding instructions (e.g., mapping state instructions (or data)) for implementing the list-to-buffer mapping state registers 430, 432 in the state registers 428. The list-to-buffer mapping state register 430 for the LLR buffer 422 and the list-to-buffer mapping state register 432 for the even bit buffer 424 in the state registers 428 can be manipulated by the polar decoder 402 to avoid explicit LLR and bit memory copy operations to implement the SCL decoding. By way of example, the list-to-buffer mapping state registers 430, 432 can respectively be a (λ+1) by L matrix and each mapping element of the matrix can be represented by log 2(L) bits (e.g., by 2 bits).

FIG. 6 illustrates an example of a list-to-buffer mapping state register 600 implemented as a 4×4 matrix for an LLR buffer. In some examples, the LLR buffer can correspond to the LLR buffer 422, as illustrated in FIG. 4 or the LLR buffer 500, as illustrated in FIG. 5. Thus, the list-to-buffer mapping state register 600 can correspond to the list-to-buffer mapping state register 430, as illustrated in FIG. 4. The even bit buffer 424 can have a similar structured list-to-buffer mapping state register as the list-to-buffer mapping state register 600 for the LLR buffer, as illustrated in FIG. 6.

The list-to-buffer mapping state register 600 can be employed by the polar decoder 402 to implement the SCL decoding with a list size of 4 (e.g., L=4). However, in other examples, a different matrix having different dimensional characteristics can be employed to implement the SCL decoding with a different list size (e.g., L=8). As illustrated in FIG. 6, each row of the list-to-buffer mapping state register 600 can be associated with the given stage of the SCL decoding (e.g., labeled in FIG. 6 as "Stage 0," "Stage 1," "Stage 2," and "Stage 3". For example, the stages can include "Stage 0," "Stage 1," "Stage 2," . . . "Stage λ−1," "Stage λ"). Each column of the list-to-buffer mapping state register 600 can be associated with a given path. Since L=4, a first column can be associated with path 0 (labeled as "l=0"), a second column can be associated with path 1 (labeled as "l=1"), a third column can be associated with path 2 (labeled as "l=2"), and a fourth column can be associated with path 4 (labeled as "l=3").

In further examples, each mapping element (e.g., value) of the list-to-buffer mapping state register 600 can be associated with (e.g., mapped to) a group of memory elements of the LLR buffer for a given path. As such, each mapping element of the list-to-buffer mapping state register 600 for a given stage of the SCL decoding can correspond to memory elements of the LLR buffer for the given path. For example, as illustrated in FIG. 6, the mapping element with a dotted pattern at l=0, Stage 0 can be mapped to (e.g., linked to) memory elements 64, 65, 66, 67, 80, 81, 82, 83, 96, 97, 98, 99, 112, 113, 114 and 115 of the LLR buffer 500 for p=0,1, as illustrated in FIG. 5. Thus, the dotted filled cell patterns can map to l=0 (p=0,1), stage=0, wherein p=0 indicates that the cell is associated with the first component decoder and p=1 indicates that the cell is associated with the second component decoder. Accordingly, each mapping element of the list-to-buffer mapping state register 600 can correspond to one stage of one path according to a list size.

The polar decoder 402 can be configured to employ the list-to-buffer mapping state registers 430, 432 to determine which memory locations needs to be read from for loading LLR calculations and bit calculations at the given stage. As such, each mapping element (e.g., value) of the list-to-buffer mapping state registers 430, 432 can be indicative of which buffer (e.g., memory locations) need to be read from for loading LLR computations during LLR update iterations (e.g., as implemented by an LLR updater 434) and which bit buffer (e.g., memory locations) that need to be read from for loading even bit values for bit update iterations (e.g., as implemented by a bit updater 436). For example, for Stage 0, the pattern (e.g., the first row) is 0 0 0 0 can be indicative that for each path (e.g., l=0 to 3) LLR computations can be loaded from buffer 0 (l=0). A given buffer can correspond to memory locations in the LLR buffer 422 (e.g., the LLR buffer 500) for each path from which LLR computations (e.g., values) are to be loaded into the polar decoder 402 implementing the component decoders.

By way of further example, if the pattern is 0 1 2 3, for example, as in a second row of the list-to-buffer mapping state register 600 this pattern can be indicative that for path l=0 that LLR computations can be loaded from buffer 0 (l=0), for path l=1 LLR computations from buffer 1 can be loaded, for path l=2 LLR computations from buffer 2 can be loaded, and for path l=3 LLR computations from buffer 3 can be loaded. Following each LLR and bit update for each stage, the list-to-buffer mapping state registers 430, 432 can be reset, for example, by the loop controller 414 (e.g., reset the contents of list-to-buffer mapping state register 600 (one row for that stage) to value "0 1 2 3". Accordingly, by manipulating the list-to-buffer mapping state register 600 computationally expensive LLR and bit memory copy updates can be avoided (e.g., manipulation of the LLR buffer 422 and the even bit buffer 424 directly can be avoided).

In some examples, the polar decoder 402 can be configured to cause the vector processor 400 to load into respective vector registers 420 the first and second set of bits of vector $\hat{x}$ (e.g., bits $\hat{x}_0 \ldots \hat{x}_7$ and $\hat{x}_8 \ldots \hat{x}_{15}$). For example, the polar decoding algorithm 404 can be executed to supply the stream of instructions corresponding to polar decoding instructions to the instruction decoder 412. The polar decoding instructions can be indicative of loading into the vector registers 420 a given set of bits of the vector $\hat{x}$ from the vector memory 408. As such, the instruction decoder 412 can be configured to receive the streams of instructions indicative of loading into vector registers 420 the first and second set of bits of vector $\hat{x}$ (e.g., bits $\hat{x}_0 \ldots \hat{x}_7$ and $\hat{x}_8 \ldots \hat{x}_{15}$).

In some examples, the loop controller 414 can be configured to receive or retrieve the given set of bits of vector $\hat{x}$ loaded into the vector registers 420 for decoding. Each of the component decoders being implemented by the polar decoder 402 can be configured to decode bits of vector $\hat{x}$ based on decoding sequencing data of the polar decoding algorithm. The decoding sequencing data can characterize a decoding graph for each respective component decoder being implemented on the polar decoder 402 for performing the SCL decoding. Each component decoder can be configured to decode the given set of bits of vector $\hat{x}$ based on the decoding graph to estimate the transmitted bits.

FIG. 7 illustrates an example of a decoding graph 700 for a component decoder. In some examples, the component decoder can be implemented by the loop controller 414, as illustrated in FIG. 4. The decoding graph 700 can be representative of a successive cancellation (SCL) algorithm that can be implemented by the polar decoder 402 for decoding of the given set of bits of vector $\hat{x}$. The polar decoder 402 can be configured to decode the given set of bits of vector $\hat{x}$ to estimate a given set of bits of vector d based on the decoding graph 700.

For example, the component decoders being implemented by the polar decoder 402 can be configured to estimate bits $d_0 \ldots d_7$ corresponding to the first set of bits of vector d. The estimated bits $d_0 \ldots d_7$ can be represented as $u_0 \ldots u_7$. The component decoders can be configured to estimate (e.g., decode) a respective set of bits of vector d as $u_0 \ldots u_7$ and $u_8 \ldots u_{15}$ according to the decoding graph 700. The estimated first and second set of bits of vector d (e.g., bits $d_1 \ldots d_{15}$) can be stored in the vector memory 408 as vector u. Thus, the vector u can be represented as $u=[u_0 \ldots u_{15}]$. Examples are presented with respect to polar decoding the first set of bits of vector $\hat{x}$ (e.g., bits $\hat{x}_0 \ldots \hat{x}_7$) by the component decoders according to the decoding graph 700.

Decoding of the second set of bits of vector $\hat{x}$ (e.g., bits $\hat{x}_8 \ldots \hat{x}_{15}$) can be implemented in a same or similar manner as described herein with respect to the first set of bits of vector $\hat{x}$.

As illustrated in FIG. 7, the decoding graph 700 includes 4 stages: Stage 0, Stage 1, Stage 2, and Stage 3. Stages 1-3 can include a set of f and g computation nodes (labeled in FIG. 5 as "f" and "g" respectively). As described herein, each of the f and g computation nodes can compute a new LLR based on prior computed LLRs. With respect to the decoding graph 700, LLR computations (e.g., values) can be denoted as L(r, c), where r and c correspond to a graph bit index (row index) and stage index, respectively. The decoding graph 700 can further include at an output of the f and g computations at Stage 3 a decision unit that can be representative of a hard decision block (labeled in FIG. 5 as "h"). Each hard decision block can be configured to make a hard decision based on an LLR value outputted from a corresponding f and g node at Stage 3. By way of example, the hard decision block can be represented by the following equation:

$$h(L(r,c))=1 \text{ if } L(r,c)<0 \text{ and}$$

$$h(L(r,c))=0 \text{ if } L(r,c)>0. \quad (1)$$

Thus, based on the LLR values outputted at Stage 3, the hard decision block can make a hard decision and output an estimate bit value u, wherein i indicates a bit index for a bit in the vector u. For example, based on the sign of an LLR value at Stage 3, a determination can be made based on equation (1) to decide whether the bit is a 0 or 1 (e.g., if L(0,3)<0, than u(0,3) is 1, otherwise u(0,3) is 0).

Each of the f and g computation nodes for computing LLR values can be implemented by one of the following functions:

$$L_{l,i} = \begin{cases} f(L_{l+1,i}; L_{l+1,i+2^l}) & \text{if } B(l, i) = 0 \quad (2) \\ g(\hat{s}_{l,i-2^l}; L_{l+1,i-2^l}; L_{l+1,i}) & \text{if } B(l, i) = 1 \quad (3) \end{cases},$$

wherein $\hat{s}$ is a modulo-2 partial sum of decoded bits (e.g., a soft decoded bit), $B(l,i) \triangleq i/2^l \mod 2$, $0 \leq l < n$, and $0 \leq i < N$.

In the LLR domain, functions f and g from equations (2) and (3) can be expressed by the following respective functions:

$$f(a,b) \approx \text{sign}(a)\text{sign}(b)\min(|a|,|b|) \quad (4)$$

$$g(a,b) = a(-1)^{u_o} + b \quad (5),$$

wherein a and b are inputs into respective functions.

Figure 8:
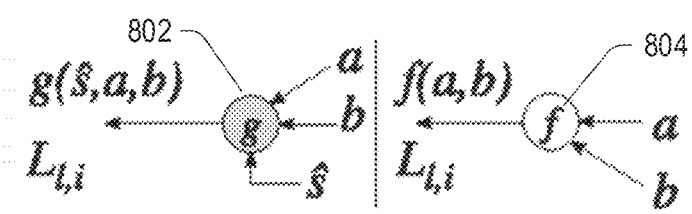
FIG. 8 illustrates an example of a graphical representation of an f-computation node and a g-computation node.

FIG. 8 illustrates an example of a graphical representation 800 of an f-computation node 802 and a g-computation node 804 that can be implemented according to equations (4) and (5), respectively. The f-and-g-computation nodes 802, 804 can correspond to the f-and-g-computation nodes, as illustrated in FIG. 7. As illustrated in FIG. 8, the f-computation node 802 can compute $f$ as soon as $a = LLR_{l+1,i}$ and b $LLR_{l+1,i+2^l}$ can be available. To compute g at the g-computation node 804, can require knowledge of $\hat{s}$, which can be computed using decoding graph 700. For example, $\hat{s}_{2,1}$ can be estimated by propagating 1 in the decoding graph 700: $\hat{s}_{2,1} = u_1 \oplus u_3$. This partial sum of $\hat{u}_0^3$ can then be used to compute $L_{2,5} = f(\hat{s}_{2,1}; L_{3,1}; L_{3,5})$ at the f-computation node at Stage 2. The need for partial sum computations can result in data dependencies in the decoding graph 700. Resultantly, this can constrain an order in which the LLR computations are computed in the decoding graph 700.

Continuing with the example of the decoding graph 700, decision outputs from respective hard decision blocks, as illustrated in FIG. 7, can be stored in a respective buffer. As illustrated in FIG. 7, a hard decision output bit designated with an "e" (e.g., $u_e$ (0,3)) can indicate that the output bit is stored at an even bit buffer (e.g., the even bit buffer 424, as illustrated in FIG. 4), and hard decision output bit designated with an "o" (e.g., $u_o$ (0,3)) can indicate that the output bit is stored at an odd bit buffer (e.g., the odd bit buffer 426).

By way of example, the polar decoding process can begin at Stage 0 of the decoding graph 700. For example, at Stage 0, the polar decoder 402 implementing the component decoders can be configured to compute LLRs for each bit of the given set of bits of vector $\hat{x}$ (e.g., bits $\hat{x}_0 \ldots \hat{x}_7$). For example, for bit $\hat{x}_0$ the component decoders can be configured to compute an LLR value (representative as L(0,0)), for bit $\hat{x}_1$ the component decoders can be configured to compute an LLR value (representative as L(1,0)), etc. To decode the bits $u_e(0,3) \ldots u_o(0,3)$ corresponding to bits $u_0 \ldots u_7$ of vector u, LLR update iterations (e.g., recursions) can be implemented by the polar decoder 402 along the decoding graph 700 in a backward way (e.g., from a right-side to the left-side of the decoding graph 700).

In some examples, to decode a bit $u_e(0,3)$ at a first bit index (e.g., bit index 0), the loop controller 414 can be configured to determine a number of LLR update iterations for decoding the given bit. For example, the instructions decoder 412 can be configured to receive computation instructions for a given bit index (e.g., the bit that is to be decoded). The computation instructions can specify a number of f or g computations corresponding to a number of LLR update iterations that is to be performed by the polar decoder 402 implementing the component decoders.

The loop controller 414 can be configured to determine that a first bit (e.g., bit $u_0$) at the bit index 0 is to be decoded and provide LLR update instructions indicative that 7-f computations are to be implemented for a given LLR update iteration to decode the first bit according to the decoding graph 700. The bit index phi=0 can be represented in binary format as 3b'000. For example, the loop controller 414 can be configured to evaluate the binary representation of bit index phi, and determine (e.g., count) how many tailing "0" and first "1" after tailing "0". The first least significant bit (LSB) can correspond to stage λ and the second LSB can correspond to stage λ−1 etc. The number of f-computations for a respective stage s can be determined by the loop controller 414 based on $2^{(\lambda-s)}$. For example, for stage λ, $2^{(\lambda-\lambda)}=1$ f-computation can be determined is to be computed by the polar decoder 402 if the first LSB is "0", otherwise 1 g-computation can be determined is to be computed by the polar decoder 402 if the first LSB is "1". For stage λ−1, $2^{(\lambda-(\lambda-1))}=2$ f-computations can be determined are to be computed by the polar decoder 402, if a second LSB is "0", otherwise 2 g-computations can be determined are to be computed by the polar decoder 402 if the second bit is "1". For stage λ−2, $2^{(\lambda-(\lambda-2))}=4$ f-computations can be determined are to be computed by the polar decoder 402 if a third LSB is "0", otherwise 4 g-computations can be determined are to be computed by the polar decoder 402 if the third LSB is "1". As such, tailing "0" plus the "1" right next to the tailing "0" can be evaluated by the loop controller 414 to determine a number of f and g computations (e.g., operations) that are to be implemented at each stage during the polar decoding process.

In some examples, for $N_P=8$, $\lambda=3$, bit index phi can be represented by a 3-bit binary. Phi=0 can be represented by 3'b000 which can have three tailing zeros (e.g., "000"), the loop controller 414 can be configured to cause the polar decoder 402 to implement 7 f-computations in order to determine the first bit at the first bit index. For example, to decode bit $u_e(0,3)$ at the first bit index based on the decoding sequencing data corresponding to the decoding graph 700, the polar decoder 402 can employ an LLR updater 434. The polar decoder 402 can cause L(0,0) and L(1,0) values to be loaded from the LLR buffer 422 into the vector registers 420 for LLR computations by the LLR updater 434. The LLR updater 434 can be configured to implement an f-computation at the f-computation node at Stage 1 of the decoding graph 700. In response to computing L(0,1), L(1,1)), L(2,1), L(3,1) at Stage 1, these computed LLR values can be loaded and the LLR updater 434 can be configured to implement an f-computation at the f-computation node at Stage 2 of the decoding graph 700. As such, the LLRs at Stage 1 can be updated as follows with respect to the LLR buffer 422 by the LLR updater 434:

L(0,1)=ƒ(L(0,0),L(1,0)) (load from memory elements 64, 65 of the LLR buffer 422 and save LLR to memory element 32 of the LLR buffer 422);

L(1,1)=ƒ(L(2,0),L(3,0)) (load from memory elements 80, 81 of the LLR buffer 422 and save LLR to memory element 33 of the LLR buffer 422);

L(2,1)=ƒ(L(4,0),L(5,0)) (load from memory elements 96, 97 of the LLR buffer 422 and save LLR to memory element 48 of the LLR buffer 422); and L(3,1)=ƒ(L(6,0),L(7,0)) (load from memory elements 112, 113 of the LLR buffer 422 and save LLR to memory element 49 of the LLR buffer 422).

LLRs at Stage 2 can be updated as follows:

L(0,2)=ƒ(L(0,1),L(1,1)) (load from memory elements 32, 33 of the LLR buffer 422 and save LLR to memory element 16 of the LLR buffer 422); and L(1,2)=ƒ(L(2,1),L(3,1)) (load from memory elements 48, 49 of the LLR buffer 422 and save LLR to memory element 17 of the LLR buffer 422).

LLRs at Stage 3 can be updated as follows:

L(0,3)=ƒ(L(0,2),L(1,2)) (load from memory elements 16, 17 of the LLR buffer 422 and save LLR to memory element 0 of the LLR buffer 422).

In response to computing L(0,3), the polar decoder 402 can be configured to apply a hard decision on L(0,3) to get $u_e(0,3)$ corresponding to the first bit at the first bit index of vector u as follows:

$$u_e(0,3)=h(L(0,3))$$

Since L=4, each of the above steps can be implemented in a vectorized manner by the LLR updater 434. For example, for:

l=0, p=0,L(0,1)=ƒ(L(0,0),L(1,0)) (load from memory elements 64, 65 of the LLR buffer 422 and save LLR to memory element 32 of the LLR buffer 422);

l=0, p=1,L(0,1)=ƒ(L(0,0),L(1,0)) (load from memory elements 66, 67 of the LLR buffer 422 and save LLR to memory element 34 of the LLR buffer 422);

l=1, p=0,L(0,1)=ƒ(L(0,0),L(1,0)) (load from memory elements 68, 69 of the LLR buffer 422 and save LLR to memory element 36 of the LLR buffer 422);

l=1, p=1,L(0,1)=ƒ(L(0,0),L(1,0)) (load from memory elements 70, 71 of the LLR buffer 422 and save LLR to memory element 38 of the LLR buffer 422);

l=2,p=0,L(0,1)=ƒ(L(0,0),L(1,0)) (load from memory elements 72, 73 of the LLR buffer 422 and save LLR to memory element 40 of the LLR buffer 422);

l=2, p=1,L(0,1)=ƒL(0,0),L(1,0)) (load from memory elements 74, 75 of the LLR buffer 422 and save LLR to memory element 42 of the LLR buffer 422);

l=3,p=0,L(0,1)=ƒ(L(0,0),L(1,0)) (load from memory elements 76, 77 of the LLR buffer 422 and save LLR to memory element 44 of the LLR buffer 422);

l=3,p=1,L(0,1)=ƒ(L(0,0),L(1,0)) (load from memory elements 78, 79 of the LLR buffer 422 and save LLR to memory element 46 of the LLR buffer 422);

l=0, p=0,L(1,1)=ƒ(L(2,0),L(3,0)) (load from memory elements 80, 81 of the LLR buffer 422 and save LLR to memory element 33 of the LLR buffer 422);

l=0, p=1,L(1,1)=ƒ(L(2,0),L(3,0)) (load from memory elements 82, 83 of the LLR buffer 422 and save LLR to memory element 35 of the LLR buffer 422);

l=1, p=0,L(1,1)=ƒ(L(2,0),L(3,0)) (load from memory elements 84, 85 of the LLR buffer 422 and save LLR to memory element 37 of the LLR buffer 422);

l=1, p=1,L(1,1)=ƒ(L(2,0),L(3,0)) (load from memory elements 86, 87 of the LLR buffer 422 and save LLR to memory element 39 of the LLR buffer 422);

l=2, p=0,L(1,1)=ƒ(L(2,0),L(3,0)) (load from memory elements 88, 89 of the LLR buffer 422 and save LLR to memory element 41 of the LLR buffer 422);

l=2, p=1,L(1,1)=ƒ(L(2,0),L(3,0)) (load from memory elements 90, 91 of the LLR buffer 422 and save LLR to memory element 43 of the LLR buffer 422)

l=3, p=0,L(1,1)=ƒ(L(2,0),L(3,0)) (load from memory elements 92, 93 of the LLR buffer 422 and save LLR to memory element 45 of the LLR buffer 422); and l=3, p=1,L(1,1)=ƒ(L(2,0),L(3,0)) (load from memory elements 94, 95 of the LLR buffer 422 and save LLR to memory element 47 of the LLR buffer 422).

As illustrated above, 8 f-computations can be implemented of L(0,1)=ƒ(L(0,0),L(1,0)) and 8 f-computations can be implemented of L(1,1)=ƒ(L(2,0),L(3,0)) to compute the bit at the first bit index. As such, LLRs stored at memory elements 64 ... 95 can be provided to the LLR updater 434 as LLR input vectors and updates can be written by the LLR updater 434 to memory elements 32 ... 47. The LLRs from memory elements 64 ... 69 can correspond to one row in the LLR buffer 422 and can be representative of a first LLR input vector. The LLRs from memory elements 80 ... 95 can correspond to another row and can be representative of a second input LLR vector. The LLR updater 434 can receive the first and second input LLR vectors. The LLR updater 434 can be configured to process the first and second input LLR vectors according to the number of f-computations determined by the loop controller 414 and output a resultant LLR output vector to the vector registers 420. The resultant LLR output vector can be written to memory elements 32 ... 37. Accordingly, each f-vector instruction can update two LLRs. For the third stage for the bit at bit index 0, a single LLR can be updated. In some examples, the LLR buffer 422 (e.g., the LLR buffer 500) can include a dummy field (indicated with "-"), such that two LLRs can updated thereby maximizing the vectorization process.

In response to decoding the bit at the bit index 0, the polar decoder 402 can proceed to decode the bit at bit index 1 (e.g., $u_o(0,3)$). The instruction decoder 412 can be configured to receive LLR computation instructions indicative that 1-g computation is to be implemented for LLR update iteration. The loop controller 414 can be configured to determine that bit index 1 is to be decoded based on the LLR computation instructions. The bit index 1 can be represented in binary format 3b'001. The loop controller 414 can be configured to evaluate the LLR computation instructions to determine (e.g., count) how many tailing "0" and first "1" after tailing "0" are in the LLR computation instruction. As such, when the tailing binary representation is "001," the LLR updater 436 can be configured to perform 1-g computation. For example, for:

L(0,3)=g(L(0,2),L(1,2),$u_o$(0,3)) (load from memory elements 16, 17 of the LLR buffer 422 and save LLR to memory element 0 of the LLR buffer 422).

In response to computing L(0,3), the polar decoder 402 implementing the component decoders can be configured to load decoded bit $u_o$(0,3) from the even bit buffer 424 at memory element 0. The polar decoder 402 can be configured to implement the hard decision on L(0,3) to get $u_o$(0,3) as follows:

$u_o$(0,3)=h(L(0,3))

For LLR update, in some examples, 4 stages (Stage 0 . . . 3) can be employed and each stage can have 8 LLRs (index 0 . . . 7). In the LLR buffer 422, in some examples, 15 bytes can be used represent LLRs since the polar decoder 402 can be configured to perform LLR update in recursive way. As described herein, for memory elements of the LLR buffer 422 that may be no longer needed, the polar decoder 402 can be configured to overwrite the buffer (e.g., the memory elements) with LLRs for decoding of other bits based on the polar decoding algorithm 404. For example, as illustrated by the examples described herein, LLR of bit index 1 can be written to memory element for L(0,3) rather than memory element for L(1,3). Because bit index 0 and L(0,3) for bit 0 have been decoded, the memory locations in the LLR buffer 422 for these values can be used for decoding bit index 1.

In response to decoding the bit at bit index 1, the polar decoder 402 can be configured to implement a bit update recursion along the decoding graph 700 in a forward direction (e.g., from the left-side to the right-side of the graph 700) based on the polar decoding algorithm 404. Because the binary representation can be "001" for bit index 1, the loop controller 414 can be configured to receive bit computation instructions based on the polar decoding algorithm 404 specifying that one bit update is to be implemented by the polar decoder 402. For example, to implement bit update for $u_e$(0,2) and $u_e$(1,2), the polar decoder 402 can employ a bit updater 436. The bit updater 436 can be configured to implement the bit update recursion based on bit update instructions received at the instruction decoder 412 based on the polar decoding algorithm 404. The bit update instructions can cause the bit updater 436 to compute bit updates for $u_e$(0,2) and $u_e$(1,2) as follows:

$u_e$(0,2)=$u_e$(0,3)⊕$u_o$(0,3) (load from memory element 0 of the even bit buffer 424 and load from memory element 0 of the odd bit buffer 426, save to memory element 16 of the even bit buffer 424); and $u_e$(1,2)=$u_o$(0,3) (save to memory element 17 of the even bit buffer 424).

By way of example, the bits computed during bit update recursion can be stored in separated buffers, the odd and even bit buffers 424, 426, respectively. As explained herein, the arrangement of each buffer 424, 426 can be similar to the LLR buffer 422. Thus, each of the buffers 424, 426 can be arranged as an 8×16 matrix. Since LLRs are updated recursively, then 2Np-1=2×8-1=15 bytes buffer can be needed for $N_p$-bit (8-bit) component decoder being implement by the polar decoder 402. The vector processor 400 can be configured for even bits to implement recursive bit update, and two (2) $2N_p$-1 bits buffers can be employed because bit update can be done in the forward direction of the graph 700. Each element of matrix for each buffer 424, 426 can be one bit (e.g., in comparison each memory element of LLR buffer 422 can be one byte). In the example above, $u_e$(0,3) used in computing $u_e$(0,2) can be retrieved by the bit updater 436 from the even bit buffer 424 and $u_o$(0,3) used in computing $u_e$(0,2), and $u_o$(0,3) can be retrieved by the bit updater 436 from the odd bit buffer 426.

In response to computing bit updates for $u_e$(0,2) and $u_e$(1,2), the polar decoder 402 can be configured to decode the bit at bit index 2 (e.g., $u_o$(0,3)). The instruction decoder 412 can be configured to receive LLR computation instructions indicative that 2-g computations are to be implemented for LLR update iteration. The loop controller 414 can be configured to determine that bit index 2 is to be decoded based on the LLR computation instructions. For example, for bit index 2, the binary representation can be 3b'010. The loop controller 414 can be configured to evaluate the LLR computation instructions to determine (e.g., count) how many tailing "0" and first "1" after tailing "0" are in the LLR computation instructions. As such, when the tailing binary representation is "010," the LLR updater 436 can be configured to perform 1-g computation to update the LLRs at Stage 2. For example, for:

L(0,2)=g(L(0,1), L(1,1), $u_e$(0,2)) (load from memory elements 32, 33 of the LLR buffer 422 and save LLR to memory element 16 of the LLR buffer 422, load bit from memory element 16 of the even bit buffer 424); and L(1,2)=g(L(2,1), L(3,1), $u_e$(1,2) (load from memory elements 48, 49 of the LLR buffer 422 and save LLR to memory element 17 of the LLR buffer 422, load bit from memory element 17 of the even bit buffer 424).

The LLR at Stage 2 for bit index 2 can be updated as follows, for example: L(0,3)=f(L(0,2), L(1,2)) (load from memory elements 16, 17 of the LLR buffer 422 and save LLR to memory element 0 of the LLR buffer 422).

The polar decoder 402 can be configured to perform the hard decision on L(0,3) for bit index 2 to get $u_e$(0,3) as follows:

$u_e$(0,3)=h(L(0,3)).

By implement the hard decision on L(0,3) for bit index 2, the polar decoder 402 can be configured to write $u_e$(0,3) to memory element 0 of the LLR buffer 422 and overwrite $u_e$(0,3) corresponding to the bit at bit index 1. Since bit index 2 is an even bit index, the polar decoder 402 can be configured to suspend (e.g., skip) bit update recursion for bit index 2.

In response to decoding the bit for bit index 2, the polar decoder 402 can be configured to decode bit index 3 (e.g., $u_e$(0,3)). The instruction decoder 412 can be configured to receive LLR computation instructions indicative that 1-g computation is to be implemented for LLR update iteration. The loop controller 414 can be configured to determine that bit index 3 is to be decoded based on the LLR computation instructions. For example, for bit index 3, the binary representation can be 3b'011. The loop controller 414 can be configured to evaluate the LLR computation instructions to determine (e.g., count) how many tailing "0" and first "1" after tailing "0" are in the LLR computation instruction. As such, when the tailing binary representation is "011," the LLR updater 436 can be configured to perform 1-g computation to update the LLRs at Stage 3. For example, for:

L(0,3)=g(L(0,2), L(1,2), $u_e$(0,3)) (load from memory elements 16, 17 of the LLR buffer 422 and save LLR to memory element 0 of the LLR buffer 422, load decoded bit $u_e(0,3)$ from even bit buffer 424 at memory element 0)

The polar decoder 402 can be configured to perform the hard decision on L(0,3) for bit index 3 to get $u_e(0,3)$ as follows:

$$u_0(0,3)=h(L(0,3)).$$

In response to decoding the bit at bit index 3, the polar decoder 402 can be configured to implement the bit update recursion along the decoding graph 700 in the forward direction. Because binary representation for bit index 3 can be "011", the loop controller 414 can be configured to receive bit computation instructions specifying that three bit updates are to be implemented by the polar decoder 402. For example, to implement bit update for $u_0(0,2)$ and $u_0(1,2)$, the polar decoder 402 can be configured to employ the bit updater 436. The bit updater 436 can be configured to implement bit update recursion based on bit update instructions received at the instruction decoder 412 based on the polar decoding algorithm 404. The bit update instructions can cause the bit updater 436 to compute bit updates for $u_0(0,2)$ and $u_0(1,2)$ as follows:

$u_o(0,2)=u_e(0,3) \oplus u_o(0,3)$ (load from memory element 0 of the even bit buffer 424 and load from memory element 0 of the odd bit buffer 426, save to memory element 16 of the odd bit buffer 426)

$u_o(1,2)=u_o(0,3)$ (save to memory element 17 of the odd bit buffer 426);

$u_e(0,1)=u_e(0,2) \oplus u_o(0,2)$ (load from memory element 16 of the even bit buffer 424 and load from memory element 16 of the odd bit buffer 426, save to memory element 32 of the even bit buffer 424)

$u_e(1,1)=u_o(0,2)$ (save to memory element 33 of the even bit buffer 424);

$u_e(2,1)=u_e(1,2) \oplus u_o(1,2)$ (load from memory element 17 of the even bit buffer 424 and load from memory element 17 of the odd bit buffer 426, save to memory element 48 of the even bit buffer 424); and $u_e(3,1)=u_o(1,2)$ (save to memory element 49 of the even bit buffer 424).

In response to computing bit updates for $u_o(0,2)$ and $u_o(1,2)$, the polar decoder 402 can be configured to decode bit index 4 (e.g., $u_e(0,3)$). The instruction decoder 412 can be configured to receive LLR computation instructions indicative that 4 g-computations and 3 f-computations are to be implemented for LLR update iteration. The loop controller 414 can be configured to determine that bit index 4 is to be decoded based on the LLR computation instructions. For example, for bit index 4, the binary representation can be 3b'100. The loop controller 414 can be configured to evaluate the LLR computation instructions to determine (e.g., count) how many tailing "0" and first "1" after tailing "0" are in the LLR computation instruction. As such, when the tailing binary representation is "100," the LLR updater 436 can be configured to perform 4 g-computations and 3 f-computations to update the LLRs at Stage 3. For example, for:

L(0,1)=g(L(0,0), L(1,0), $u_e(0,1)$) (load from memory elements 64, 65 of the LLR buffer 422 and save LLR to memory element 32 of the LLR buffer 422, load bit from memory element 32 of the even bit buffer 424);

L(1,1)=g(L(2,0), L(3,0), $u_e(1,1)$) (load from memory elements 80, 81 of the LLR buffer 422 and save LLR to memory element 33 of the LLR buffer 422, load bit from memory element 33 of the even bit buffer 424));

L(2,1)=g(L(4,0), L(5,0), $u_e(2,1)$) (load from memory elements 96, 97 of the LLR buffer 422 and save LLR to memory element 48 of the LLR buffer 422, load bit from memory element 48 of the even bit buffer 424)); and L(3,1)=g(L(6,0), L(7,0), $u_e(3,1)$) (load from memory elements 112,113 of the LLR buffer 422 and save LLR to memory element 49 of the LLR buffer 422, load bit from memory element 49 of the even bit buffer 424)).

The LLR update 436 can be configured to perform 2 f-computations for bit index 4 to update the LLRs at Stage 2. For example, at Stage 2, the LLR updater 436 can be configured to compute 2 LLR updates as follows:

L(0,2)=f(L(0,1), L(1,1)) (load from memory elements 32, 33 of the LLR buffer 422 and save LLR to memory element 16 of the LLR buffer 422); and L(1,2)=f(L(2,1), L(3,1)) (load from memory elements 48, 49 of the LLR buffer 422 and save LLR to memory element 17 of the LLR buffer 422).

The LLR update 436 can be configured to perform 1 f-computation for bit index 4 to update the LLRs at Stage 3. For example, at Stage 3, the LLR update 436 can be configured to compute 1 LLR update as follows:

L(0,3)=f(L(0,2),L(1,2)) (load from memory elements 16, 17 of the LLR buffer 422 and save LLR to memory element 0 of the LLR buffer 422).

The polar decoder 402 can be configured to perform the hard decision on L(0,3) for bit index 4 to get $u_e(0,3)$ as follows:

$$u_e(0,3)=h(L(0,3)).$$

Because bit index 4 is an even bit index, the polar decoder 402 can be configured to skip bit update recursion for bit index 4 and proceed to decode bit index 5 (e.g., $u_o(0,3)$).

The instruction decoder 412 can be configured to receive LLR computation instructions indicative that 1-g computation is to be implemented for LLR update iteration. The loop controller 414 can be configured to determine that bit index 5 is to be decoded based on the LLR computation instructions. For example, for bit index 5, the binary representation can be 3b'101. The loop controller 414 can be configured to evaluate the LLR computation instructions to determine (e.g., count) how many tailing "0" and first "1" after tailing "0" are in the LLR computation instruction. As such, when the tailing binary representation is "101," the LLR updater 436 can be configured to perform 1-g computation to update the LLRs at Stage 3. For example, at Stage 3, the LLR update instructions can cause the LLR updater 436 to compute 1 LLR update as follows:

L(0,3)=g(L(0,2), L(1,2), $u_e(0,3)$) (load from memory elements 16, 17 of the LLR buffer 422 and save LLR to memory element 0 of the LLR buffer 422, load decoded bit $u_e(0,3)$ from the even bit buffer 424 at memory element 0).

The polar decoder 402 can be configured to perform the hard decision on L(0,3) for bit index 5 to get $u_o(0,3)$ as follows:

$$u_o(0,3)=h(L(0,3)).$$

In response to decoding the bit at bit index 5, the polar decoder 402 can be configured to implement the bit update recursion along the decoding graph 700 in the forward direction. Because binary representation for bit index 5 can be "101", the loop controller 414 can be configured to receive bit computation instructions specifying that three bit updates are to be implemented by the polar decoder 402. For example, to implement bit update for $u_e(0,2)$ and $u_e(1,2)$, the polar decoder 402 can be configured to employ the bit updater 436. The bit updater 436 can be configured to implement bit update recursion based bit update instructions received at the instruction decoder 412 based on the polar decoding algorithm 404. The bit update instructions can cause the bit updater 436 to compute bit updates for $u_e(0,2)$ and $u_e(1,2)$ as follows:

$u_e(0,2) = u_e(0,3) \oplus u_o(0,3)$ (load from memory element 0 of the even bit buffer 424 and load from memory element 0 of the odd bit buffer 426, save to memory element 0 of the even bit buffer 424); and $u_e(1,2) = u_o(0,3)$ (save to memory element 1 of the even bit buffer 424).

In response to computing bit updates for $u_e(0,2)$ and $u_e(1,2)$, the polar decoder 402 can be configured to decode bit index 6 (e.g., $u_e(0,3)$). The instruction decoder 412 can be configured to receive LLR computation instructions indicative that 2 g-computations are to be implemented for LLR update iteration. The loop controller 414 can be configured to determine that bit index 6 is to be decoded based on the LLR computation instructions. For example, for bit index 6, the binary representation can be 3b'100. The loop controller 414 can be configured to evaluate the LLR computation instructions to determine (e.g., count) how many tailing "0" and first "1" after tailing "0" are in the LLR computation instruction. As such, when the tailing binary representation is "100," the LLR updater 436 can be configured to perform 2-g computations to update the LLRs at Stage 4. For example, at Stage 2, the LLR updater 436 can be configured to implement 2 g-computations as follows:

$L(0,2) = g(L(0,1), L(1,1), u_e(0,2))$ (load from memory elements 32, 33 of the LLR buffer 422 and save LLR to memory element 16 of the LLR buffer 422, load bit from memory element 16 of the even bit buffer 424); and $L(1,2) = g(L(2,1), L(3,1), u_e(1,2))$ (load from memory elements 48, 49 of the LLR buffer 422 and save LLR to memory element 17 of the LLR buffer 422, load bit from memory element 17 of the even bit buffer 424)

In some examples, the LLR updater 436 can be configured to update $L(0,3)$ at Stage 3 for bit index 6 as follows:

$L(0,3) = f(L(0,2), L(1,2))$ (load from memory elements 16, 17 of the LLR buffer 422 and save LLR to memory element 0 of the LLR buffer 422).

The polar decoder 402 can be configured to implement the hard decision on $L(0,3)$ for bit index 6 to get $u_e(0,3)$ as follows:

$u_e(0,3) = h(L(0,3))$.

Since bit index 6 is an even bit index, the polar decoder 402 can be configured to skip bit update recursion for bit index 6 and proceed to decode bit index 7 (e.g., $u_o(0,3)$). The instruction decoder 412 can be configured to receive LLR computation instructions indicative that 1-g computation is to be implemented for LLR update iteration. The loop controller 414 can be configured to determine that bit index 7 is to be decoded based on the LLR computation instructions. For example, for bit index 7, the binary representation can be 3b'111. The loop controller 414 can be configured to evaluate the LLR computation instructions to determine (e.g., count) how many tailing "0" and first "1" after tailing "0" are in the LLR computation instruction. As such, when the tailing binary representation is "111," the LLR updater 436 can be configured to perform 1-g computation to update the LLRs at Stage 3.

For example, at Stage 3, the LLR updater 436 can be configured to compute 1 LLR update as follows:

$L(0,3) = g(L(0,2), L(1,2), u_e(0,3))$ (load LLR values from memory element 16 and 17 of the LLR buffer 422 and save computed LLR values to memory element 0 of the LLR buffer 422, load decoded bit $u_e(0,3)$ from even bit buffer 424 at memory element 0).

The polar decoder 402 can be configured to implement the hard decision on $L(0,3)$ for bit index 6 to get $u_o(0,3)$ as follows:

$u_o(0,3) = h(L(0,3))$.

Since bit index 7 is the last bit index, the polar decoder 402 can be configured to skip bit update recursion for bit index 7.

By way of example, during each LLR and bit update iteration, as described herein, the polar decoder 402 can be configured to employ a path manager 438. The path manager 438 can be configured to kill and clone paths by manipulating the list-to-buffer mapping state register 430 for the LLR buffer 422 and list-to-buffer mapping state register 432 for the even bit buffer 424 for each LLR and bit update iteration, respectively. When a path is killed (e.g., pruned), the LLR and bit memory needs to be freed and made available for new path, and when a path is cloned, LLRs and bits can be copied to the new LLR and bit memory locations. However, cloning of the new path takes many computer cycles to implement.

In the examples described herein, the path manager 438 can be configured to kill and clone paths by manipulating the list-to-buffer mapping state register 430 for the LLR buffer 422 and the list-to-buffer mapping state register 432 for the even bit buffer 424 rather than manipulating the LLR or the bit memory (e.g., directly) as in the existing approaches. For example, to copy LLR memory (e.g., memory locations) from l=0 to l=2, for example, as illustrated in FIG. 6, column 0 can be copied to column 2 of the list-to-buffer mapping stage register 430. The instruction decoder 412 can be configured to receive polar decoding instructions that are indicative of a cloning command for the path manager 438 based on the polar decoding algorithm 404. The path manager 438 can be configured to manipulate the list-to-buffer mapping state register 430 to copy LLR memory or even bit memory from a given path to another path.

For example, the copying of one column to another column in the list-to-buffer mapping state registers 430, 432 for the LLR and even bit memory buffers 422, 424, respectively, can be representative of killing an existing path (e.g., l=2; freeing up LLR and bit memory) and cloning a new path (e.g., l=0). Because the path manager 438 can be configured to manipulate the list-to-buffer mapping state registers 430, 432 to kill and clone paths no actual LLR and bit memory needs to be freed as a column copy can be representative of killing paths. In response to copying a given column to another column of the list-to-buffer mapping state registers 430, 432 at the given stage, the LLRs or bit values in a corresponding buffer 422, 424 associated with the given column can be used by the LLR updater 434 or the bit updater 436 for implementing the f-or-g computations, as described herein.

Figure 9:
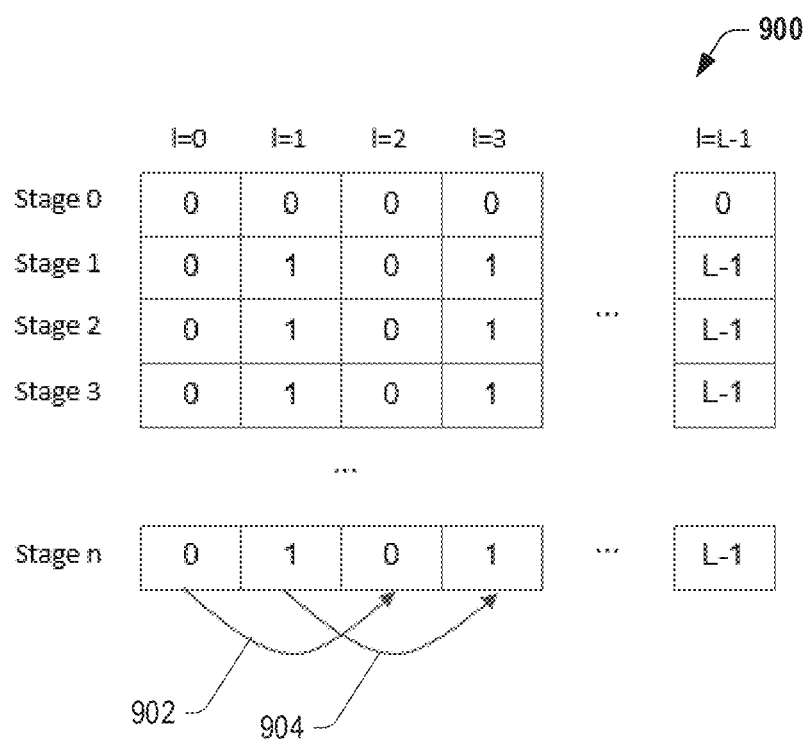
FIG. 9 illustrates an example of cloning paths with respect to a list-to-buffer mapping state register.

FIG. 9 illustrates an example of cloning paths with respect to a list-to-buffer mapping state register 900. In some examples, the list-to-buffer mapping state register 900 can correspond to the list-to-buffer mapping state register 430, as illustrated in FIG. 4. As illustrated in FIG. 9, at 902, path l=0 can be cloned to path l=2 by copying a first column to a third column of the list-to-buffer mapping state register 900. As such, to clone l=0 to l=2, the LLR and bit memory buffer from killed path l=2 can be used for the new path cloned from l=0. A path manager (e.g., the path manager 438, as illustrated in FIG. 4) can be configured to set (e.g., mark) all of the column (copy to) to a path number that is being copied from. For example, to copy from LLR memory locations (e.g., in an LLR buffer, such as the LLR buffer 422, as illustrated in FIG. 4) associated with elements in column 0 for path l=0 to path l=2, all elements of column 2 for path l=2 can be set to a path index to which a path is to be copied. Thus, to copy column 0 into column 2, elements of column 2 can be set to 0. Accordingly, after a clone (e.g., copy) all elements of column 2 (e.g., for path l=2) can be set to the path number (e.g., l=0) from which a copy occurred.

By way of further example, as illustrated in FIG. 9, at 904, path l=1 can be cloned to path l=3. To copy from LLR memory locations associated with elements in column 1 for path l=1 to path l=3, all elements of column 3 for path l=3 can be set to 1 (e.g., the path index for the first column) to which a path is to be copied. After each LLR or bit update iteration, a loop controller (e.g., the loop controller 414, as illustrated in FIG. 4) can be configured to reset the list-to-buffer mapping state register 900 for a subsequent LLR or bit update iteration. To reset the list-to-buffer mapping state register 900, the loop controller can be configured to set the elements of all rows to an original path index state. For example, all rows of column 2 can be reset back to 2 and all rows of column 3 can be reset back to 3.

Continuing with the example of FIG. 4, in some examples, the LLR updater 434 can be configured to employ the list-to-buffer mapping state register 430 for the LLR buffer 422 to shuffle input vectors of LLRs into the vector registers 420. The LLR updater 434 can be configured to shuffle the input vectors of LLRs in response to copying a given column to another column of the list-to-buffer mapping state register 430 for the LLR buffer 422 at the given stage during an LLR update iteration. For example, the LLR updater 434 can be configured to use a list-to-buffer mapping state register that has at least one copied column (e.g., the list-to-buffer mapping state register 900) for the LLR buffer 422 to shuffle the input vectors of LLRs for the g-computations and f-computations at the given stage (e.g., Stage 2).

After shuffling the input vector of LLRs, the LLR updater 434 can be configured to implement LLR updates according to the examples described herein. As explained herein, once LLR updates for the given stage of the decoding graph 700 have been completed, elements of the copied columns can be reset (e.g., set) to the original path index state for another stage of the decoding graph 700 by the loop controller 414. For example, if column 0 for path l=0 was copied into column 2 for path l=2, the loop controller 414 can be configured to reset column 2 for the path l=2 back to an original path index state (e.g., 2).

By way of further example, the LLR updater 434 can be configured to shuffle the input vectors of the LLRs into the vector registers 420 based on a sequence of values of elements of a corresponding row of the list-to-buffer mapping state register 430 for the LLR buffer 422. For example, if the polar decoder 402 is at the second stage of the decoding graph 700 (e.g., the SCL decoding algorithm), the LLR updater 434 can be configured to evaluate a row of the list-to-buffer mapping state register 430 (or the list-to-buffer mapping state register 900) for the LLR buffer 422 associated with the second stage (e.g., the second row of the list-to-buffer mapping state register 900 labeled in FIG. 9 as "Stage 2"). The LLR updater 434 can be configured to shuffle the input vectors of the LLRs when the decoding graph 700 is at second stage into the vector registers 420 based on the sequence of values of the elements in the second row of the list-to-buffer mapping state register 430, 900. Accordingly, the LLR updater 434 can be configured to shuffle the input vectors of the LLRs into the vector registers 420 based on a row pattern for a given stage for use during the f-computation.

In some examples, the bit updater 436 can be configured to employ the list-to-buffer mapping state register 432 for the even bit buffer 424 to shuffle input vectors of even bits from the even bit buffer 424 into the vector registers 420. The bit updater 436 can be configured to shuffle the input vectors of even bits in response to copying a given column to another column of the list-to-buffer mapping state register 432 for the even bit buffer 424 at the given stage during a given bit update iteration. For example, the bit updater 436 can be configured to use the list-to-buffer mapping state register 432 that has at least one copied column for the even bit buffer 426 to shuffle the input vectors of even bits for bit computations (e.g., by performing modulo 2 arithmetic) at the given stage (e.g., Stage 3). As described herein, the bit computations can be performed by the bit updater 436. In some examples, the bit updater 436 can be configured to implement a bit update recursion according to the examples herein based on the shuffled input vector of even bits. As explained herein, once bit updates for the given stage of the decoding graph 700 have been completed, elements of the copied columns can be reset (e.g., set) to the original path index state for the given stage of the decoding graph 700 by the loop controller 414. For example, if column 0 for path l=0 was copied into column 2 for path l=2, the loop controller 414 can be configured to reset column 2 for the path l=2 back to an original path index state (e.g., 2).

By way of further example, the bit updater 436 can be configured to shuffle the input vectors of the even bits into the vector registers 420 based on a sequence of values of elements of a corresponding row of the list-to-buffer mapping state register 432 for the even bit buffer 424. For example, if the polar decoder 402 is at the second stage of the decoding graph 700 (e.g., the SCL decoding algorithm), the bit updater 436 can be configured to evaluate a row of the list-to-buffer mapping state register 432 for the even bit buffer 424 associated with the second stage (e.g., the second row of the list-to-buffer mapping state register 900 labeled in FIG. 9 as "Stage 2"). The bit updater 436 can be configured to shuffle the input vectors of even bits when the decoding graph 700 is at second stage into the vector registers 420 based on the sequence of values of the elements in the second row of the list-to-buffer mapping state register 432. Accordingly, the even bit buffer 424 can be configured to shuffle the input vectors of the even bits into the vector registers 420 based on a row pattern for a given stage for use during the bit computations, as described herein.

In further examples, the polar decoder 402 includes a path metric calculator 440. The path metric calculator 440 can be configured to evaluate each path for each stage, such that a given number of L paths can survive among the $L \times 2^P$ paths generated by the polar decoder 402. In some examples, a path metric (PM) can be employed by the polar decoder 402 to determine which of the candidate paths can survive. The path metric calculator 440 can be configured to compute for each node a respective PM in the decoding graph 700. Thus, the respective PM for each node can correspond to a metric from a root node to the current node (e.g., a leaf node). The path metric calculator 440 can be configured to search the paths to find the length-n path with a largest metric as an updated survival path. Since, in some examples, the encoding bits are correlated for 4-bits in parallel decoding (e.g., P=4), the PM value for each node can be computed by the path metric calculator 440 at each node as follows:

$$PM_{out}(l,j) = \Sigma_{p=0 \ldots P-1}(PM_{in}(l)+\text{sign}(LLR(l,p))^{\wedge}v(l,p) * \text{abs}(LLR(l,p))) \quad (6),$$

wherein j is the number 4'bwxyz and w=u(l,3), x=u(l,2), y=u(l, 1) and z=u(l, 0) j is from 0 to 15 for P=4.

As such, since v(i), v(i+N/4), v(i+1N/2), v(i+3N/4) can be correlated, the independent bits can be decoded u(i),u(i+N/4), u(i+1N/2), u(i+3N/4). The independent bits can be decoded by the path metric calculator 440 by maximizing the equally combined log likelihood ratios:

$$\{\hat{u}(i), \hat{u}(i+N/4), \hat{u}(i+N/2), \hat{u}(i+3N/4)\} = \arg\left\{\min_{v_{l,i}, v_{l,i+N/4}, v_{l,i+N/2}, v_{l,i+3N/4}} PM_{out}(l, j)\right\}. \quad (7)$$

The path metric calculator 440 can be configured to select L minimal from all path metrics as survivals. The path metric calculator 440 can be configured to search L minimal values from total L×2^P path metrics. As such, input path metrics $PM_{in}$ can be kept in high precision, but path metrics $PM_{out}$ (1) for path selection can be kept in low precision. The survival path metrics are also in high precision which is calculated in path management unit.

Figure 10:
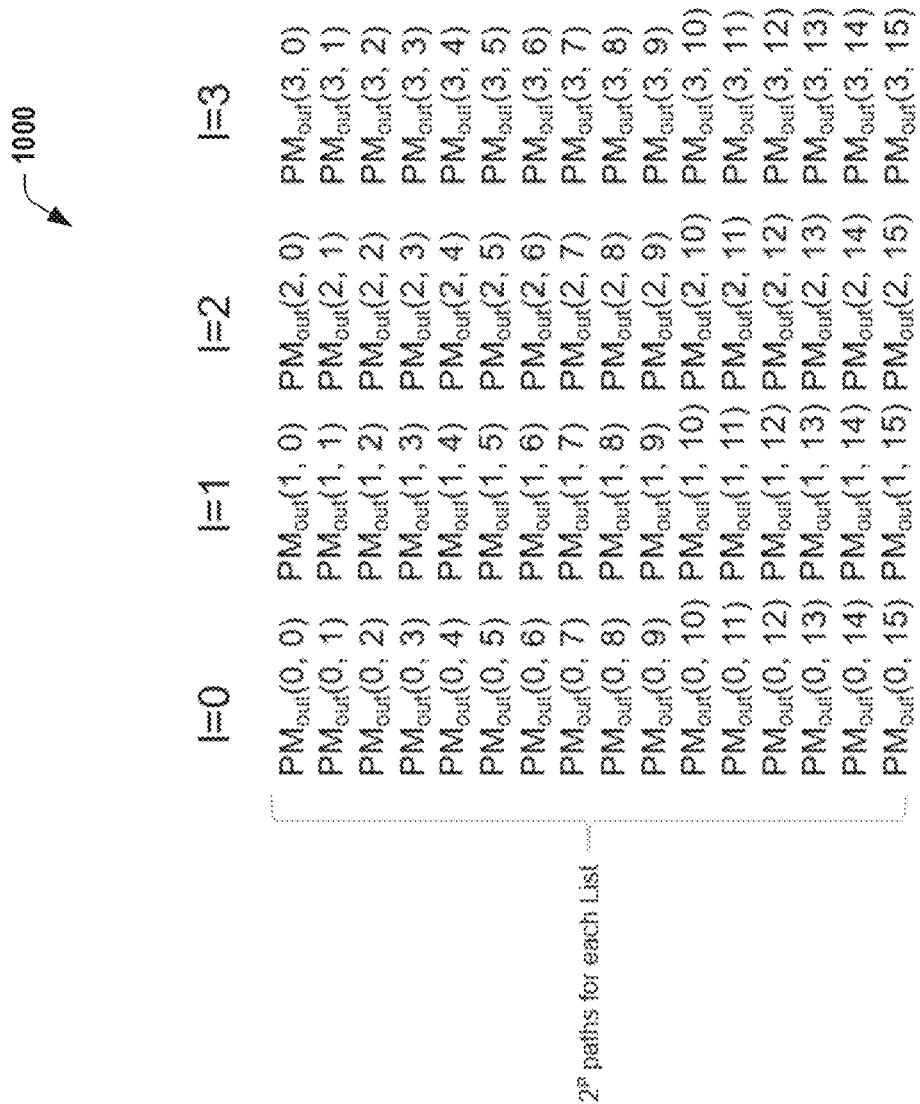
FIG. 10 illustrate an example of a path metric output list for each path that can be generated by a path metric calculator.

FIG. 10 illustrate an example of a path metric output list 1000 for each path L=0 to L=3 that can be generated by a path metric calculator. The path metric calculator can correspond to the path metric calculator 440, as illustrated in FIG. 4. The path metric calculator can be configured to evaluate the path metric output list 1000 to find the L'th minimal path metric (e.g., find maximum if the path metric is negated) from valid path metrics out of L×2^P total path metrics as the threshold. As such, an L minimum $PM_{out}$ can become $PM_{in}$ for next decoding bit. Since $PM_{out}$ can be packed into a lower precision, the L minimum $PM_{in}$ can be recalculated by the path metric calculator. The path metric calculator can threshold each $PM_{out}$ to output a path metric list (e.g., a path metric list 1200, as illustrated in FIG. 12). For example, the path metric calculator can be configured to compare each threshold each $PM_{out}$ as shown in the path metric list 1000 to a threshold to determine if each $PM_{out}$ is less than the threshold.

As illustrated in FIG. 10, for L=4 and P=4 examples, 64 path metrics can be outputted by the path metric calculator. As such, there can be 4 lists and each list can have 16 path metrics. In some examples L=4 paths output of all 64 candidates can be retained. As such, L=4 minimum path metrices output all 64 path metrics can be searched. For example, the 4 minimum path metrices can be PM0, PM1, PM2, PM3 with PM0≤PM1≤PM2≤PM3. PM3 defining the threshold. The 64 path metrics can be compared with the threshold PM3 and save the equal flag in a given matrix and less than flag into another matrix. For example, if PMout(i, j)==PM3 and then the element (i,j) can be set to be 1 as illustrated at 1102 in FIG. 11. FIG. 11 illustrates an example matrix 1102 for an equal flag and an example matrix 1104 for a less than flag. In some examples, there could be many elements (e.g., 1~64) which can be set to "1" for PMout(i, j)==PM3. In some examples, if PMout(i,j)<PM3 and then the element (i,j) can be set to 1, as illustrated in matrix 1104 in FIG. 11.

In some examples, the path metric calculator 440 can be configured to merge the two matrices (e.g., the matrices 1102 and 1104) into a single matrices. To merge the two matrices, the path metric calculator 440 can be configured to calculate a number of "1" in the second matrix 1104 (e.g., PMout(i,j)<PM3), for example, there is n "1" in the second matrix and then find the first (L−n) "1" element in the first matrices 1102 (PMout(i,j)==PM3). By combining the first and second matrices 1102, 1104, the resulting matrix can have L "1" elements, as illustrated in FIG. 12. FIG. 12 illustrates an example of a path metric list 1200. The path metric list 1200 can be representative of a matrix, such as the resulting matrix generated based on the combining of the first and second matrices 1102, 1104, as illustrated in FIG. 11.

Continuing with the example of FIG. 4, the path metric calculator 440 can be configured to provide the path metric list to the path manager 438. The path manager 438 can be configured to implement path kill and cloning based on the path metric list 1100. To implement path killing and cloning, the path manager 438 can be configured to evaluate the path metric list and identify survival paths, such as (0,0), (0,3), (1,8) and (3,14) of the path metric list 1100 (path index (r, c) where r is the path index and c is the child index). The survival paths can be represented in the path metric list 1100 with a given value, such as "1". By way of example, as illustrated in FIG. 11, there can be two survival paths that originated from the first path l=0 and one survival path that originated from second path l=1 and no survival paths that originated from third path l=2 and one survival path that originated from the forth path l=3.

In some examples, the third path l=2 can be killed since there is no path that can survive that originated from the third path l=2. By killing the third path l=2 the vector memory 408, such as the LLR buffer 422, can be freed and allocated to a new path. The new path can be one from the path which has more than one survival. For example, the first path l=0 can be determined by the path manager 438 as having 2 survival paths. The path manager 438 can be configured to copy one survival of path l=0 to path l=2. For example the path manager 438 can be configured to copy PM(0,3) to the l=2's path metric memory. Since the path metrics for L=4 can be 4 values, in some examples, a direct memory copy can be implemented.

In some examples, the copy of LLRs and bits can be implemented as described herein by updating the list-to-buffer mapping state register 430 for the LLR buffer 422 and the list-to-buffer mapping state register 432 for the even bit buffer 424. For example, if the list-to-buffer mapping state register 430 for the LLR buffer 422 resembles the list-to-buffer mapping state register 600, the LLR buffer from column 0 of l=0 can be copied to LLR buffer of column 2 of l=2 by the path manager 438, by updating the list-to-buffer mapping state register by copying the l=0 column to l=2, as illustrated in FIG. 13.

FIG. 13 illustrates an example of a list-to-buffer mapping state register 1300 with a killed path and a cloned path. In some examples, the list-to-buffer mapping state register 1300 can correspond to the list-to-buffer mapping state register 430 for the LLR buffer 422 and/or the list-to-buffer mapping stat register 432 for the even bit buffer 424, as illustrated in FIG. 4. Thus, the list-to-buffer mapping state register 1300 can be for an LLR buffer (e.g., the LLR buffer 422, as illustrated in FIG. 4) or an odd bit buffer (e.g., the even bit buffer 424, as illustrated in FIG. 4). As illustrated in FIG. 13, column 0 associated with path l=0 has been copied to column 2 associated with path l=2 by a path manager (e.g., the path manager, 438, as illustrated in FIG. 4). The list-to-buffer mapping state register 1300 can be employed by the LLR updater or the bit buffer update at a given stage of a decoding graph (e.g., the decoding graph 700, as illustrated in FIG. 7) to implement LLR or bit computations, as described herein.

Accordingly, by implementing the polar decoder 402 in a vector processing environment (e.g., the vector processor 400, as illustrated in FIG. 4) with the list-to-buffer mapping state register 430 for the LLR buffer 422 and the even bit buffer 424 computationally expensive explicit memory copy and memory allocation (e.g., freeing) functions can be avoided. Consequently, a throughput of the decoding graph (e.g., the SCL decoding algorithm) can be improved by vectoring all steps of the decoding graph and improving a performance of the polar decoder overall. Accordingly, the polar decoder 402 can be implemented on a general purpose vector processor rather than a chip with fixed hardware.

In view of the foregoing structural and functional features described above, example methods will be better appreciated with references to FIGS. 14-17. While, for purposes of simplicity of explanation, the example methods of FIGS. 14-17 are shown and described as executing serially, it is to be understood and appreciated that the example method is not limited by the illustrated order, as some actions could in other examples occur in different orders, multiple times and/or concurrently from that shown and described herein.

Figure 14:
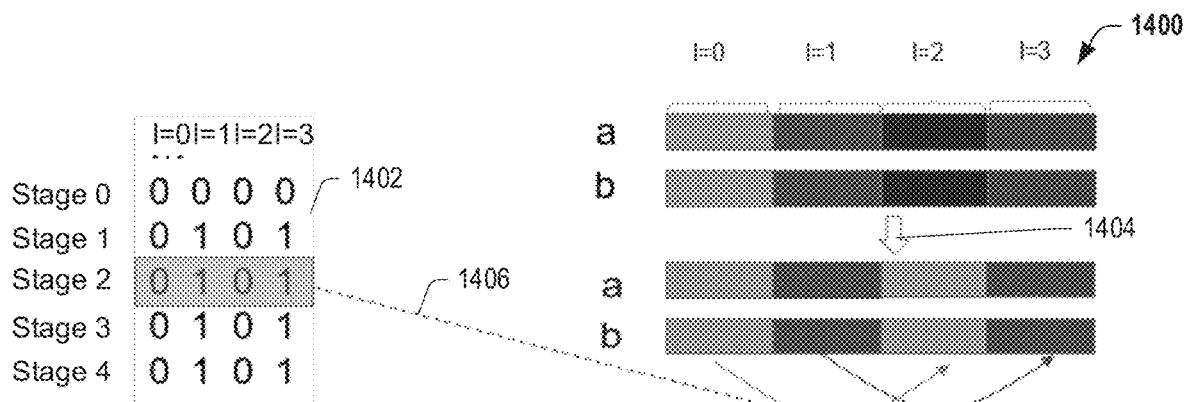
FIG. 14 illustrates an example of a method of shuffling input vectors of LLRs for an f-computation at a given stage based on a list-to-buffer mapping state register.

FIG. 14 illustrates an example of a method 1400 of shuffling input vectors of LLRs based on a list-to-buffer mapping state register for an f-computation at a given stage. In the method 1400 of FIG. 14, L=4. The method 1400 can be implemented by a vector processor (e.g., the vector processor 400, as illustrated in FIG. 4). Thus, in some examples, the method 1400 can be implemented by the polar decoder 402, as illustrated in FIG. 4. Although the method 1400 is described with respect to Stage 2, a similar method can be employed for shuffling input vectors of LLRs for A other stages, such as stage s=0, s=1, s=3 and s=4, such as described herein.

The method 1400 can begin at 1402 with a list-to-buffer mapping state register for an LLR buffer being configured by a loop controller (e.g., the loop controller 414, as illustrated in FIG. 4), such that elements of column 2 can be set to number 0 and elements of column 3 can be set to number 1 (e.g., based on a column cloning operation). In some examples, the list-to-buffer mapping state register can correspond to the list-to-buffer mapping state register 430 for the LLR buffer 422, as illustrated in FIG. 4 or the list-to-buffer mapping state register 900, as illustrated in FIG. 9. For example, the loop controller can be configured to clone a first column for l=0 to a third column for l=2 in the list-to-buffer mapping state register, and clone a second column for l=1 to a fourth column l=3 in the list-to-buffer mapping state register.

At 1404, an LLR updater (e.g., the LLR updater 434, as illustrated in FIG. 4) can be configured to retrieve (e.g., load) a set of input vectors of LLR values at a given stage for an L path number into vector registers (e.g., the vector registers 420, as illustrated in FIG. 4). As such, the LLR updater can be configured to load into the vector registers the set of input vectors having LLRs values for each path number (e.g., l=0 to l=3). The set of input vectors can include a first input vector (e.g., labeled in FIG. 14 as "a") and a second input vector (e.g., labeled in FIG. 14 as "b"). Each of the first and second input vectors can be retrieved from (or form part of) an LLR buffer (e.g., the LLR buffer 422, as illustrated in FIG. 4). At 1406, the LLR updater can be configured to shuffle at least one input vector of LLR values of the set of input vectors of LLR values based on the list-to-buffer mapping state register for the LLR buffer.

For example, at least one input vector of the LLRs can be shuffled, such that LLR values associated with a given path for a respective input vector are shuffled (e.g., copied) into different locations of the respective input vector. The LLR updater can be configured to read a row of the list-to-buffer mapping state register for the LLR buffer, such as for example associated with Stage 2 of the list-to-buffer mapping state register for the LLR buffer. Based on the row pattern at Stage 2, the LLR updater can be configured to shuffle LLR values of the at least one input vector. For example, if the row associated with Stage 2 has the pattern "0 1 0 1", as illustrated in FIG. 9, the LLR updater can be configured to copy LLR values of the at least one input vector from l=0 to l=2 and/or copy LLR values of the at least one input vector from l=1 to l=3.

In other examples, if the pattern is "0 0 2 3", the LLR updater can be configured to copy LLR values of the respective input vector from l=0 to l=1. In further examples, if the pattern is "0 1 2 2", the LLR updater can be configured to copy LLR values of the respective input vector l=2 to l=3. In even further examples, if the pattern is "0 0 3 3, the LLR updater can be configured to copy LLR values of the respective input vector l=0 to l=1 and copy from l=3 to l=2. After copying the LLR values into new locations of the at least one input vector, the set of input vectors of LLR values can be employed by the LLR updater to implement f-computations. Accordingly, LLRs of the at least one input vector can be shuffled prior to f-computations by using a given pattern of a corresponding row of the list-to-buffer mapping state register for the LLR buffer. In some examples, the f-computation can be represented on the vector processor as a 2LP-way single instruction, multiple data (SIMD) operation. As such, a and b in function (4) are 2LP-way vectors corresponding to the first and second input vectors in the example of FIG. 14.

Figure 15:
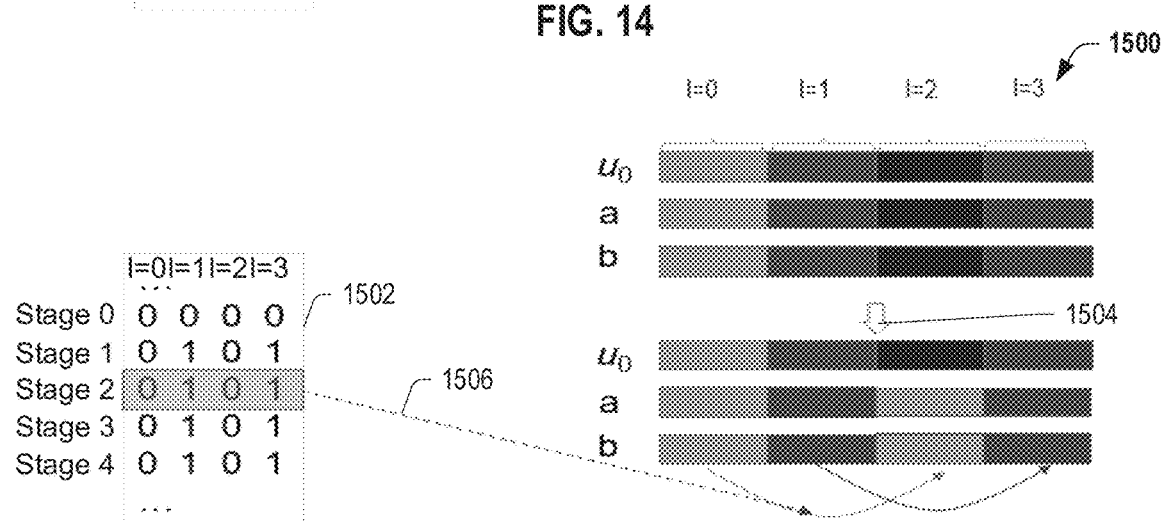
FIG. 15 illustrates an example of a method of shuffling input vectors of LLRs for a g-computation at a given stage based on a list-to-buffer mapping state register.

FIG. 15 illustrates an example of a method 1500 of shuffling input vectors of LLRs based on a list-to-buffer mapping state register for a g-computation at a given stage. In the method 1500 of FIG. 15, L=4. The method 1500 can be implemented by a vector processor (e.g., the vector processor 400, as illustrated in FIG. 4). Thus, in some examples, the method 1500 can be implemented by the polar decoder 402, as illustrated in FIG. 4. Although the method 1500 is described with respect to Stage 2, a similar method can be employed for shuffling input vectors of LLRs for A other stages, such as stage s=0, s=1, s=3 ands=4, such as described herein.

The method 1500 can begin at 1502 with a list-to-buffer mapping state register for an LLR buffer being configured by a loop controller (e.g., the loop controller 414, as illustrated in FIG. 4), such that elements of column 2 can be set to number 0 and elements of column 3 can be set to number 1 (e.g., based on a column cloning operation). In some examples, the list-to-buffer mapping state register for the LLR buffer can correspond to the list-to-buffer mapping state register 430 for the LLR buffer 422, as illustrated in FIG. 4 or the list-to-buffer mapping state register 900, as illustrated in FIG. 9. For example, the loop controller can be configured to clone a first column for l=0 to a third column for l=2 in the list-to-buffer mapping state register, and clone a second column for l=1 to a fourth column l=3 in the list-to-buffer mapping state register for the LLR buffer.

At 1504, an LLR updater (e.g., the LLR updater 434, as illustrated in FIG. 4) can be configured to retrieve (e.g., load) a set of input vectors of LLR values and even bit values at a given stage for an L path number into vector registers (e.g., the vector registers 420, as illustrated in FIG. 4). In the example of FIG. 15, L=4. As such, the LLR updater can be configured to load into the vector registers the set of input vectors having LLRs and even bit values for each path number (e.g., l=0 to l=3) for the g-computation. As illustrated in FIG. 15, the set of input vectors can include a first LLR input vector (e.g., labeled in FIG. 15 as "a"), a second LLR input vector (e.g., labeled in FIG. 15 as "b"), and an even bit input vector (labeled in FIG. 15 as "$u_o$"). Each of the first and second LLR input vectors can be retrieved from an LLR buffer (e.g., the LLR buffer 422, as illustrated in FIG. 4). The even bit input vector can be retrieved from an even bit buffer (e.g., the even bit buffer 424, as illustrated in FIG. 4). At 1506, the LLR updater can be configured to shuffle at least one LLR input vector of LLR values of the set of input vectors based on the list-to-buffer mapping state register for the LLR buffer.

For example, the at least one LLR input vector of LLR values can be shuffled, such that the LLR values associated with a given path for a respective input vector are shuffled (e.g., copied) into different locations of the respective input vector. For example, the LLR updater can be configured to read a row of the list-to-buffer mapping state register of the LLR buffer associated with Stage 2, as illustrated in FIG. 15. Based on the row pattern at Stage 2, the LLR updater can be configured to shuffle LLR values. For example, if the row associated with Stage 2 has the pattern "0 1 0 1", as illustrated in FIG. 15, the LLR updater can be configured to copy LLR values of the at least one LLR input vector from l=0 to l=2 and copy LLR values of the at least one LLR input vector from l=1 to l=3. In other examples, if the pattern is "0 0 2 3", LLR updater can be configured to copy LLR values of the respective input vector from l=0 to l=1. In further examples, if the pattern is "0 1 2 2", LLR updater can be configured to copy LLR values of the respective input vector l=2 to l=3. In even further examples, if the pattern is "0 0 3 3", the LLR updater can be configured to copy LLR values of the respective input vector l=0 to l=1 and copy from l=3 to l=2. After copying the LLR values into new locations of the at least one LLR input vector of LLR values, the first and second LLR input vectors and the even bit input vector can be employed by the LLR updater to implement the g-computation at the given stage, as described herein. Accordingly, LLRs of input vectors can be shuffled prior to g-computations by using a given pattern of a corresponding row in the list-to-buffer mapping register. In some examples, the g-computation can be represented on the vector processor as a 2LP-way SIMD operation. As such, a, b and u in equation (9) are 2LP-way vectors corresponding to the first and second LLR input vectors of LLR values and the even bit input vector of even bit values in the example of FIG. 15.

Figure 16:
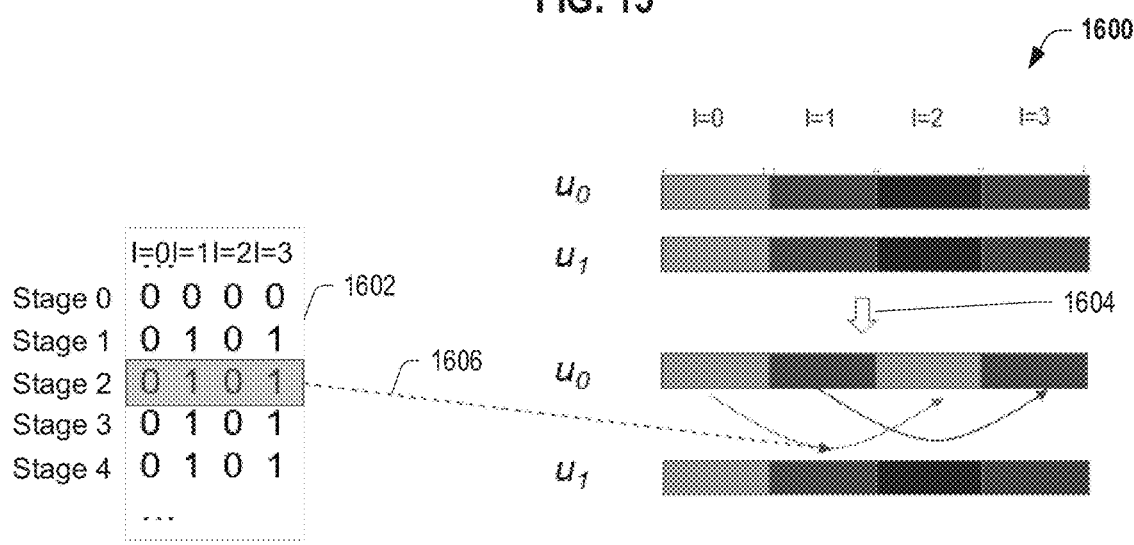
FIG. 16 illustrates an example of a method of shuffling bit input vectors for an even bit update at a given stage based on a list-to-buffer mapping state register.

FIG. 16 illustrates an example of a method 1600 of shuffling bit input vectors based on a list-to-buffer mapping state register for an even bit update at a given stage. In the method 1600 of FIG. 16 L=4. The method 1600 can be implemented by a vector processor (e.g., the vector processor 400, as illustrated in FIG. 4). Thus, in some examples, the method 1600 can be implemented by the polar decoder 402, as illustrated in FIG. 4. Although the method 1600 is described with respect to Stage 2, a similar method can be employed for shuffling input vectors of LLRs for A other stages, such as stage s=0, s=1, s=3 and s=4, such as described herein.

The method 1600 can begin at 1602 with a list-to-buffer mapping state register (e.g., the list-to-buffer mapping state register 432, as illustrated in FIG. 1) for an even bit buffer (e.g., the even bit buffer 424, as illustrated in FIG. 4) being configured by a loop controller (e.g., the loop controller 414, as illustrated in FIG. 4), such that elements of column 2 can be set to 0 and elements of column 3 can be set to number 1, as explained herein. For example, a loop controller (e.g., the loop controller 414, as illustrated in FIG. 4) can be configured to clone a first column for l=0 to a third column for l=2 in the list-to-buffer mapping state register for the even bit buffer, and clone a second column for l=1 to a fourth column l=3 in the list-to-buffer mapping state register for the even bit buffer.

At 1604, a bit updater (e.g., the bit updater 436, as illustrated in FIG. 4) can be configured to retrieve (e.g., load) a set of input vectors of bit values at a given stage for an l path number into vector registers (e.g., the vector registers 420, as illustrated in FIG. 4). In the example of FIG. 16, L=4. As such, the bit updater can be configured to load into the vector registers the set of input vectors having bit values for each path number (e.g., l=0 to l=3) for a bit value update computation. As illustrated in FIG. 16, the set of input vectors can include a first bit input vector (e.g., labeled in FIG. 11 as "$u_e$"), a second bit input vector (e.g., labeled in FIG. 11 as "$u_o$"). The first bit input vector can be retrieved from the even bit buffer (e.g., the even bit buffer 424, as illustrated in FIG. 4). The second bit input vector can be retrieved from the odd bit buffer (e.g., the odd bit buffer 426, as illustrated in FIG. 4). At 1606, the bit updater can be configured to shuffle the first bit input vector of bit values from the even bit buffer based on the list-to-buffer mapping state register for the even bit buffer (e.g., the list-to-buffer mapping state register 432, as illustrated in FIG. 4). Since the second bit input vector is from the odd bit buffer, the second bit input vector is not shuffled by the bit updater.

For example, the first bit input vector of bit values from the even bit buffer can be shuffled, such that the bit values associated with a given path for a respective even bit input vector are shuffled (e.g., copied) into different locations of the respective even bit input vector. For example, the bit updater can be configured to read a row of the list-to-buffer mapping state register for the even bit buffer associated with Stage 2, as illustrated in FIG. 16. Based on the row pattern at Stage 2, the bit updater can be configured to shuffle bit values in the first bit input vector of bit values from the even bit buffer. For example, if the row associated with Stage 2 has the pattern "0 1 0 1", as illustrated in FIG. 16, the bit updater can be configured to copy bit values of the first bit input vector of bit values from the even bit buffer from l=0 to l=2 and copy bit values of the first bit input vector of bit values from the even bit buffer from l=1 to l=3. In other examples, if the pattern is "0 0 2 3", the bit updater can be configured to copy bit values of the first bit input vector of bit values from the even bit buffer from l=0 to l=1. In further examples, if the pattern is "0 1 2 2", bit updater can be configured to copy bit values of the first bit input vector of bit values from the even bit buffer from l=2 to l=3. In even further examples, if the pattern is "0 0 3 3", the bit updater can be configured to copy bit values of the first bit input vector of bit values from the even bit buffer from l=0 to l=1 and copy from =3 to l=2.

After copying the bit values into new locations of the first bit input vector of bit values from the even bit buffer corresponding to shuffling the bit values of the first bit input vector of bit values from the even bit buffer, the bit updater can be configured to implement a bit update at the given stage, as describe herein. Accordingly, bit values of even bit input vectors can be shuffled prior to bit computations by using a given pattern of a corresponding row in the list-to-buffer mapping register for the even bit buffer. In some examples, the bit update can be represented on the vector processor as 2LP-way vectors on the vector processor. As such bit vectors $u_0$ and $u_1$ as illustrated in FIG. 16 can be represented as 2LP-way vectors on the vector processor.

Figure 17:
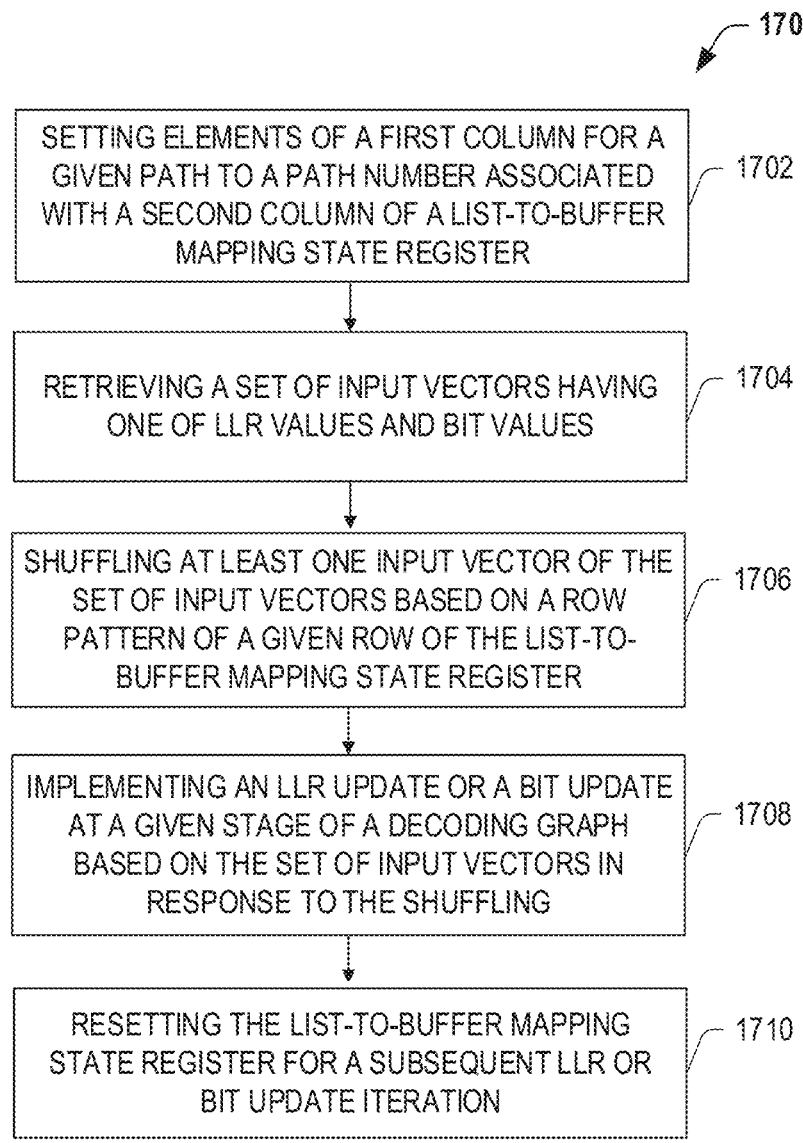
FIG. 17 illustrates an example of a method for implementing an LLR update or a bit update at a given stage of a decoding graph based on a list-to-buffer mapping state register.

FIG. 17 illustrates an example of a method 1700 for implementing an LLR update or bit update at a given stage of a decoding graph based on a list-to-buffer mapping state register. The method 1700 can be implemented by a vector processor (e.g., the vector processor 400, as illustrated in FIG. 4). Thus, in some examples, the method 1700 can be implemented by the polar decoder 402, as illustrated in FIG. 4. The decoding graph can correspond graph 700, as illustrated in FIG. 7. The list-to-buffer mapping state register can correspond to one of the list-to-buffer mapping state registers 430, 432, as illustrated in FIG. 4, and the list-to-buffer mapping state register 900, as illustrated in FIG. 9.

The method 1700 can begin at 1702 by setting (e.g., by the instruction decoder 412, as illustrated in FIG. 4) elements of a first column (copy to) for a given path of the list-to-buffer mapping state register to a path number associated with a second column of the list-to-buffer mapping state register having elements that are to be copied to the element of the given column. The copying of the elements from the second column to the first column can replace the elements of the first column with the elements of the second column. Each element of the list-to-buffer mapping state register can be associated with (e.g., mapped to) memory locations of a given buffer, such as the LLR buffer 422, as illustrated in FIG. 4, the LLR buffer 500, as illustrated in FIG. 5, the even bit buffer 424, as illustrated in FIG. 4, or the odd bit buffer 426, as illustrated in FIG. 4. For example, to copy from LLR memory locations in the LLR buffer associated with elements in column 0 of the list-to-buffer mapping state register for path l=0 to path l=2, all elements of column 2 for path l=2 can be set to a path index to which a path is to be copied.

At 1704, retrieving (e.g., via the LLR updater 434 or the bit updater 436) data from at least one buffer representative of a set of input vectors having one of LLR values or bit values. The at least one buffer can include the given buffer. At 1706, shuffling (e.g., via the LLR updater 434 or the bit updater 436) at least one input vector of the set of input vectors based on a row pattern of a given row of the list to-buffer mapping state register. For example, if the given row associated with Stage 2 has the pattern "0 1 0 1", as illustrated in FIG. 9, the LLR updater can be configured to copy LLR or bit values of the at least one input vector from l=0 to l=2 and/or copy LLR or bit values of the at least one input vector from l=1 to l=3. At 1708, implementing the LLR update or the bit update at the given stage of the decoding graph based on the set of input vectors in response to shuffling at least one input vector of the set of input vectors. The LLR update or the bit update can include a g-computation, an f-computation, and/or a bit computation, such as described herein. At 1710, resetting the list-to-buffer mapping state register (e.g., by the loop controller 414, as illustrated in FIG. 4) for a subsequent LLR or bit update iteration. To reset the list-to-buffer mapping state register, a loop controller (e.g., the loop controller 414, as illustrated in FIG. 4) can be configured to set the elements of given row to an original path index state.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A polar decoder for implementing polar decoding of a codeword, the polar decoder comprising:
   a loop controller configured to implement in a vector memory of a vector processor a logarithmic likelihood ratio (LLR) buffer, an even bit buffer, and an odd bit buffer based on memory arrangement data;
   an LLR updater configured to employ a list-to-buffer mapping state register for the LLR buffer for loading stored LLR values from the LLR buffer for each path at a given stage of a decoding graph and storing updated LLR values in the LLR buffer at each LLR update iteration during the polar decoding of the codeword; and
   a bit updater configured to employ a list-to-buffer mapping state register for the even bit buffer for loading stored even bit values from the even bit buffer for each path at the given stage of the decoding graph and loading odd bit values from the odd bit buffer at each bit update iteration during the polar decoding of the codeword.

2. The polar decoder of claim 1, wherein the loop controller is configured to determine a number of f computations and/or g-computations for computing the updated LLR values at each stage based on a number of tailing zeros and a first one after tailing zeros of a binary representation of an LLR computation instruction received at the polar decoder.

3. The polar decoder of claim 1, further comprising a path manager configured to kill and clone paths by manipulating the list-to-buffer mapping state registers for the LLR buffer and/or the even bit buffer for each LLR and bit update iteration during the polar decoding of the codeword.

4. The polar decoder of claim 3, wherein the path manager is configured to manipulate the list-to-buffer mapping state register for the LLR buffer and/or the even bit buffer by copying elements of a given column to another column of the list-to-buffer mapping state register for the LLR buffer and the even bit buffer.

5. The polar decoder of claim 4, wherein the path manager is configured to copy the elements of the given column to the other column by setting the elements of the other column to the values of given column to provide an updated list-to-buffer mapping state register for the LLR buffer and/or the even bit buffer.

6. The polar decoder of claim 5, wherein the LLR updater is configured to use the LLR values for each path at the given stage for f-computations and/or g-computations in response to copying the elements of given column to the other column.

7. The polar decoder of claim 6, wherein the bit updater is configured to:
   retrieve a set of vectors of bit values comprising even bit values and odd bit values from the even and odd bit buffers, respectively; and
   shuffle a vector of even bit values of the set of vectors of bit values during each bit update iteration based on the updated list-to-buffer mapping state register for the even bit buffer.

8. The polar decoder of claim 7, wherein the bit updater is configured to shuffle the at least one vector of the even bit values based on a row pattern for the given stage of the list-to-buffer mapping state register for the even bit buffer.

9. The polar decoder of claim 5, wherein the loop controller is configured to reset the list-to-buffer mapping state register for a subsequent LLR or bit update iteration at another stage following each LLR or bit update iteration at the given stage, such that all elements of the other column for the given stage are set back to the path number associated with the other column.

10. The polar decoder of claim 5, further comprising a path metric calculator configured to evaluate each path constructed by each child node originated from each parent node and generate a path metric (PM) indicative of a likelihood of a path being a correct codeword.

11. The polar decoder of claim 10, wherein the path metric calculator is configured to search all paths identified for bit stream from bit index 0 to current bit index in decoding graph and compare PM for each path to a threshold to generate a threshold path metric list, the path manager being configured to employ the threshold path metric list to kill and clone the paths to update the list-to-buffer mapping state register for the LLR buffer and the list-to-buffer mapping state register for the even bit buffer.

12. The polar decoder of claim 5, wherein each of the LLR buffer, the even bit buffer and the odd bit buffer are organized as a two-dimensional array that can have $N_P$ rows and each row can have 2LP memory elements, wherein L is a list size for the decoding graph, P is a number of component decoders, and $N_P$ is a block size of a corresponding component decoder.

13. The polar decoder of claim 5, wherein the list-to-buffer mapping state register for each of the LLR and the even bit buffer is a ($\lambda$+1) by L matrix and each element of the matrix can be represented by log 2(L) bits, wherein L is a list size for the decoding graph and $\lambda$ is based on log 2($N_P$), wherein $N_P$ is a block size of a corresponding component decoder.

14. The polar decoder of claim 5, wherein the bit updater is configured to use the even bit values for each path at the given stage during each bit update iteration in response to copying the elements of given column to the other column.

15. The polar decoder of claim 5, wherein the loop controller is configured to retrieve a set of vectors of LLR values, the LLR updater being configured to shuffle at least one vector of LLR values of the set of vectors of LLR values for the f-computations and/or g-computations based on the updated list-to-buffer mapping state register for the LLR buffer, the LLR updater being configured to shuffle the at least one vector of LLR values based on a row pattern for the given stage of the list-to-buffer mapping state register for the LLR buffer.

16. A method for implementing a logarithmic likelihood (LLR) update or a bit update at a given stage of a decoding graph based on a list-to-buffer mapping state register comprising:
setting, via a polar decoder, elements of a column of the list-to-buffer mapping state register for a given path to a path number associated with another column of the list-to-buffer mapping state register;
retrieving, via the polar decoder, data from at least one buffer representative of a set of input vectors having one of LLR values or bit values;
shuffling, via the polar decoder, at least one input vector of the set of input vectors based on a row pattern of a given row of the list-to-buffer mapping state register and
implementing, via the polar decoder, the LLR update or the bit update at the given stage of the decoding graph based on the set of input vectors in response to shuffling the at least one input vector of the set of input vectors.

17. The method of claim 16, further comprising:
searching, via the polar decoder, paths identified for each stage of the decoding graph and comparing computed path metrics (PMs) for the paths to a threshold to generate a threshold path metric list; and
updating, via the polar decoder, the list-to-buffer mapping state register based on the threshold path metric list.

18. The method of claim 17, further comprising resetting, via the polar decoder, the list-to-buffer mapping state register for a subsequent LLR or bit update iteration by setting the elements of given row to an original path index state.

19. A system for implementing polar codeword decoding comprising:
a vector processor comprising vector memory, one or more state registers and one or more vector registers; and
a polar decoder configured to:
partition the vector memory based on memory arrangement data to implement a logarithmic likelihood ratio (LLR) buffer for storing LLR values, an even bit buffer for storing even bit values, and an odd bit buffer for storing odd bit values;
generate and store in the one or more state registers a list-to-buffer mapping state register for each of the LLR buffer and the even bit buffer based on mapping state data;
store LLR values from the LLR buffer using the one or more vector registers for each path at each node of a decoding graph during a polar decoding of the codeword based on the list-to-buffer mapping state register for the LLR buffer;
store even bit values using the one or more vector registers from the even bit buffer for each path at each node of the decoding graph during the polar decoding of the codeword based on the list-to-buffer mapping state register for the even bit buffer; and
store odd bit values using the one or more vector registers for each path at the given stage at each node of the decoding graph during the polar decoding of the codeword.

20. The system of claim 19, further comprising a memory storing machine readable instructions representative of polar decoding instructions, the machine readable instructions being executed to cause the polar decoder to decode the codeword.

* * * * *